United States Patent [19]
Koike

[11] Patent Number: 5,969,573
[45] Date of Patent: Oct. 19, 1999

[54] AMPLIFIER CIRCUIT WITH SMALL OFFSET VOLTAGE INFLUENCE

[75] Inventor: Hideharu Koike, Kawasaki, Japan

[73] Assignee: Kabushiki Kaisha Toshiba, Kawasaki, Japan

[21] Appl. No.: 08/972,143

[22] Filed: Nov. 17, 1997

[30] Foreign Application Priority Data

Nov. 18, 1996 [JP] Japan ................................. 8-306325
Oct. 16, 1997 [JP] Japan ................................. 9-283425

[51] Int. Cl.$^6$ ....................................................... H03F 3/45
[52] U.S. Cl. ........................................... 330/253; 330/260
[58] Field of Search ............................. 330/69, 252, 253, 330/259, 260, 301

[56] References Cited

U.S. PATENT DOCUMENTS

| | | | |
|---|---|---|---|
| 4,710,726 | 12/1987 | Czarnul | 330/69 |
| 5,221,909 | 6/1993 | Cole | 330/250 X |
| 5,254,956 | 10/1993 | Nishijima | 330/259 X |
| 5,493,699 | 2/1996 | Shioda et al. | 455/72 |
| 5,635,874 | 6/1997 | Perrot | 330/259 |

Primary Examiner—Steven J. Mottola
Attorney, Agent, or Firm—Oblon, Spivak McClelland, Maier & Neustadt, P.C.

[57] ABSTRACT

An amplifier circuit influenced less by an offset voltage and capable of permitting an as broad as possible dynamic range is provided. This amplifier circuit includes first and second MOS transistors M1, M2; a first operational amplifier OP1 having an inverting input terminal connected to the drain of the first MOS transistor and a non-inverting input terminal connected to the drain of the second MOS transistor; a second operational amplifier OP2 having two input terminals such that one input terminal is connected to the drain of the second MOS transistor and the other input terminal is connected to a second power supply VD; a first resistance circuit provided between the drain of the first MOS transistor and the output terminal of the first operational amplifier; a second resistance circuit having the same resistance value as that of the first resistance circuit provided between the drain of the second MOS transistor and a third power supply VC; a first load circuit for delivering load current to the drain of the first MOS transistor; and a second load circuit for delivering load current of the same value as the load current to the drain of the second MOS transistor, thus to control load currents flowing in the first and second load circuits by the output of the second operational amplifier so that the drain voltage of the second MOS transistor becomes equal to the second power supply voltage.

18 Claims, 16 Drawing Sheets

AMPLIFIER CIRCUIT WITH SMALL OFFSET VOLTAGE INFLUENCE

FIELD OF THE INVENTION

This invention relates to an amplifier circuit composed of MOS transistors, and more particularly to an amplifier circuit used as an instrumentation amplifier.

PRIOR ART

The configuration of a conventional instrumentation amplifier circuit (hereinafter simply referred to as an amplifier circuit as occasion may demand) composed of MOS transistors is shown in FIG. 25. This amplifier circuit includes two N-channel MOS transistors M1, M2, and three operational amplifiers OP1, OP2, OP3. Sources of the transistors M1, M2 are commonly connected and power supply voltage VS is applied to the commonly connected point. The drain of the transistor M1 is connected to the inverting input terminal of the operational amplifier OPT, and the drain of the transistor M2 is connected to the inverting input terminal of the operational amplifier OP2. Further, the non-inverting input terminals of the operational amplifiers OP1, OP2 are commonly connected and voltage VD is applied to the commonly connected point. In addition, the inverting input terminal of the operational amplifier OP1 and the output terminal of the operational amplifier OP1 are connected through a resistor R1, and the inverting input terminal of the operational amplifier OP2 and the output terminal of the operational amplifier OP2 are connected through a resistor R2.

The output terminal of the operational amplifier OP1 is connected to the inverting input terminal of the operational amplifier OP3 through a resistor R3, and the output terminal of the operational amplifier OP2 is connected to the non-inverting input terminal of the operational amplifier OP3 through a resistor R4. Further, the inverting input terminal and the output terminal of the operational amplifier OP3 are connected through a resistor R5. In addition, power supply voltage VC is applied to the non-inverting input terminal of the operational amplifier OP3 through a resistor R6.

In this conventional amplifier circuit, differential inputs VIN1, VIN2 are respectively inputted to gates of the transistors M1, M2, and output VOUT is taken out from the output terminal of the operational amplifier OP3.

The operation of this conventional amplifier circuit will now be described.

It is now assumed that the transistors M1, M2 carry out triode action. When drain voltages of the transistors M1, M2 are respectively designated at VD1, VD2, gate voltages thereof are respectively designated as VIN1, VIN2, source voltage thereof is designated at VS, and threshold voltage of these transistors M1, M2 is designated at VT, currents I1, I2 flowing in the transistors M1, M2 are respectively represented by the following equations.

$$I1 = 2Kn\left(VIN1 - VS - VT - \frac{(VD1 - VS)}{2}\right)(VD1 - VS) \quad (1)$$

$$I2 = 2Kn\left(VIN2 - VS - VT - \frac{(VD2 - VS)}{2}\right)(VD2 - VS) \quad (2)$$

In the above equations, Kn is expressed as follows.

$$Kn = \frac{\mu \cdot C_{0x} \cdot W}{2L}$$

where $\mu$ denotes mobility, $C_{OX}$ denotes capacitance per unit area of the gate oxide film, and W and L respectively denote gate width and gate length of the transistor.

When offset voltages of the operational amplifiers OP1, OP2 are respectively designated at VF1, VF2, drain voltages VD1 and VD2 are expressed as follows.

$$VD1 = VD + VF1 \quad (3)$$

$$VD2 = VD + VF2 \quad (4)$$

When substitution of the equations (3) and (4) into the equations (1), (2) is carried out, the following equations are provided.

$$I1 = 2Kn\left\{VIN1 - VS - VT - \frac{(VD + VF1 - VS)}{2}\right\}(VD + VF1 - VS) \quad (5)$$

$$I2 = 2Kn\left\{VIN2 - VS - VT - \frac{(VD + VF2 - VS)}{2}\right\}(VD + VF2 - VS) \quad (6)$$

$$I1 - I2 = 2KN(VIN1 - VIN2)(VD + VF1 - VS) + \quad (7)$$
$$2Kn\left\{VIN2 - VT - VD - \frac{(VF1 - VF2)}{2}\right\}(VF1 - VF2)$$

The first term of the equation (7) is a difference current proportional to a differential input voltage. The second term is error current. It is seen that this error current increases in proportion to input voltage. Since output voltage VOUT is proportional to the difference current I1–I2, when the error current increases, the error of output voltage also increases.

If VF1=VF2, the second term of the equation (7) becomes equal to zero. As a result, there is no error. However, there is also the possibility that VF1=–VF2 may hold, in the worst case. Although an operational amplifier having a small offset can be used, there is the problem that the structure of the operational amplifier becomes complicated. Moreover, in the case where a differential amplifier having a single output is required, the operational amplifier OP3 and resistors R3, R4, R5, R6 are required at the final stage as shown in FIG. 25. Also at this stage, there is the possibility that error by offset and/or error by variations of resistor may take place.

Further, output voltages V1, V2 of the operational amplifiers OP1, OP2 are respectively expressed by the following equations.

$$V1 = VD1 + R1I1 = VD + VF1 + \quad (8)$$
$$2R1Kn\left\{VIN1 - VS - VT - \frac{(VD + VF1 - VS)}{2}\right\}(VD + VF1 - VS)$$

$$V2 = VD2 + R2I2 = VD + VF2 + \quad (9)$$
$$2R2Kn\left\{VIN2 - VS - VT - \frac{(VD + VF2 - VS)}{2}\right\}(VD + VF2 - VS)$$

It is seen from the above-mentioned equations (8), (9) that V1, V2 increase in proportion to the input voltage. Thus, V1, V2 increase in proportion to the center voltage of the input voltage. For this reason, in the case where the center value (common mode) of the input voltage varies to a large degree, the problem occurs where fluctuations of V1, V2 become beyond the power supply voltage range, i.e., the dynamic range of input becomes narrow.

SUMMARY OF THE INVENTION

This invention has been made in view of the above-mentioned circumstances and its object is to provide an amplifier circuit adapted to be influenced by the offset of an operational amplifier to a small degree and have a dynamic range as broad as possible.

A first aspect of an amplifier circuit according to this invention comprises: first and second MOS transistors of a first conductivity type in which their characteristics are the same, their sources being connected commonly to a first power supply; a first operational amplifier having an inverting input terminal connected to the drain of the first MOS transistor and a non-inverting input terminal connected to the drain of the second MOS transistor; a second operational amplifier having two input terminals such that one input terminal is connected to the drain of the second MOS transistor and the other input terminal is connected to a second power supply; a first resistance circuit provided between the drain of the first MOS transistor and an output terminal of the first operational amplifier; a second resistance circuit having the same resistance value as that of the first resistance circuit provided between the drain of the second MOS transistor and a third power supply; a first load circuit for delivering load current to the drain of the first MOS transistor; and a second load circuit for delivering load current having the same value as the load current delivered to the drain of the first MOS transistor to the second MOS transistor thus to control load currents flowing in the first and second load circuits by an output of the second operational amplifier so that drain voltage of the second MOS transistor becomes equal to voltage of the second power supply.

Moreover, a second aspect of an amplifier circuit according to this invention is characterized in that, in the amplifier circuit of the first aspect, the first load circuit is comprised of a first resistance element having one end connected to the drain of the first MOS transistor and the other end connected to an output terminal of the second operational amplifier; and the second load circuit is comprised of a second resistance element having one end connected to the drain of the second MOS transistor and the other end connected to the output terminal of the second operational amplifier and having the same resistance value as that of the first resistance element.

Further, a third aspect of an amplifier circuit according to this invention is characterized in that, in the amplifier circuit of the first aspect, the first load circuit is comprised of a third MOS transistor of a second conductivity type different from the first conductivity type having a drain connected to the drain of the first MOS transistor, a gate connected to the output terminal of the second operational amplifier and a source connected to a fourth power supply; and the second load circuit is comprised of a fourth MOS transistor having a drain connected to the drain of the second MOS transistor, a gate connected to the output terminal of the second operational amplifier and a source connected to the fourth power supply, and having the same characteristics as that of the third MOS transistor of the second conductivity type.

Further, a fourth aspect of an amplifier circuit according to this invention comprises: first and second MOS transistors of a first conductivity type in which their characteristics are the same, their sources being connected commonly to a first power supply; a first operational amplifier having an inverting input terminal connected to a drain of the first MOS transistor and a non-inverting input terminal connected to a drain of the second MOS transistor; a second operational amplifier having an inverting input terminal connected to the drain of the second MOS transistor and a non-inverting input terminal connected to a second power supply; a first resistance circuit provided between the drain of the first MOS transistor and an output terminal of the first operational amplifier; a second resistance circuit provided between the drain of the second MOS transistor and an output terminal of the second operational amplifier and having the same resistance value as that of the first resistance circuit; a first load circuit connected to the drain of the first MOS transistor and operative to deliver load current to the drain of the first MOS transistor; and a second load circuit connected to the drain of the second MOS transistor and operative to deliver load current equal to the load current delivered to the drain of the first MOS transistor to the second MOS transistor to allow outputs of the first and second operational amplifiers to be differential outputs, thus to control load currents flowing in the first and second load circuits by the differential outputs.

Further, a fifth aspect of an amplifier circuit according to this invention is characterized in that, in the amplifier circuit defined in any one of the first to fourth aspects, the amplifier circuit comprises a fifth MOS transistor of the first conductivity type connected in parallel with the first MOS transistor and a sixth MOS transistor of the first conductivity type having the same characteristics as that of the fifth MOS transistor, the sixth MOS transistor being connected in parallel with the second MOS transistor.

Further, a sixth aspect of an amplifier circuit according to this invention is characterized in that, in the amplifier circuit of the fifth aspect, a divided voltage of the output voltage is applied across gates of the fifth and sixth MOS transistors.

Further, a seventh aspect of an amplifier circuit according to this invention is characterized in that, in the amplifier circuit of the sixth aspect, the first and second resistance circuits are omitted.

Further, an eighth aspect of an amplifier circuit according to this invention is characterized in that, in the amplifier circuit defined in any one of the first to sixth aspects, the first and second resistance circuits are comprised of an MRC (MOS Resistive Circuit).

Further, a ninth aspect of an amplifier circuit according to this invention is characterized in that, in the amplifier circuit defined in any one of the first to fourth aspects, the amplifier circuit further comprises a fifth MOS transistor of the first conductivity type having a source connected to a fifth power supply and a drain connected to the drain of the first MOS transistor, and a sixth MOS transistor of the first conductivity type in which its characteristics are the same characteristics as that of the fifth MOS transistor, the sixth MOS transistor having a source connected to the fifth power supply and a drain connected to the drain of the second MOS transistor.

Further, a tenth aspect of an amplifier circuit according to this invention is characterized in that, in the amplifier circuit of the ninth aspect, the amplifier circuit further comprises a voltage dividing circuit provided in place of the first and second resistance circuits and operative to divide a voltage between output of the first operational amplifier and a potential of the third power supply, a fall-wave rectifying circuit for allowing output of this voltage dividing circuit to undergo full-wave rectification, a low-pass filter for waveform-shaping and phase-adjusting output of the full-wave rectifying circuit, and a transconductance at circuit adapted to receive an output of the low-pass filter, an output of the transconductance circuit being caused to serve as the voltage of the fifth power supply, wherein an output voltage of the voltage dividing circuit is applied across gates of the fifth and sixth MOS transistors.

In addition, an eleventh aspect of an amplifier circuit according to this invention is characterized in that, in the amplifier circuit of the tenth aspect, the amplifier circuit comprises a voltage dividing circuit provided in place of the first and second resistance circuits and operative to divide a voltage between an output of the first operational amplifier and a potential of the third power supply, a full-wave rectifying circuit adapted to receive differential input voltages applied to the first and second MOS transistors to allow them to undergo full-wave rectification, a low-pass filter for waveform-shaping and phase-adjusting output of the full-wave rectifying circuit, and a transconductance circuit adapted to receive an output of the low-pass filter, and an output of the transconductance circuit being caused to serve as voltage of the first power supply, wherein an output voltage of the voltage dividing circuit is applied across gates of the fifth and sixth MOS transistors.

EMBODIMENTS

Preferred embodiments of an amplifier circuit according to this invention will now be described with reference to the attached drawings.

Figure 1:
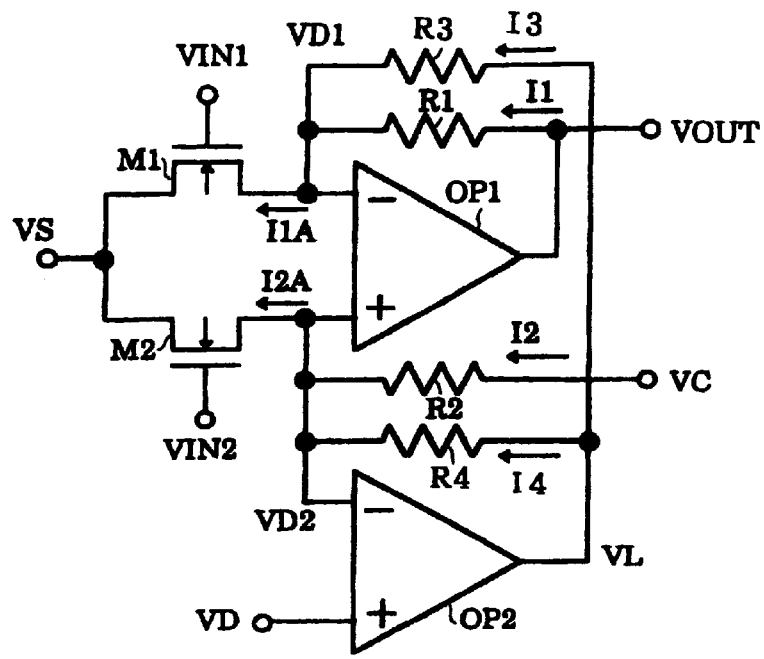
FIG. 1 is a circuit diagram showing the configuration of a first embodiment of an amplifier circuit according to this invention.

The configuration of the first embodiment of the amplifier circuit according to this invention is shown in FIG. 1. The amplifier circuit of this embodiment comprises two N-channel MOS transistors M1, M2 and two operational amplifiers OP1, OP2. Sources of the transistors M1, M2 are commonly connected, and a power supply voltage VS is applied to the commonly connected point. One input potential VIN1 of differential inputs of the amplifier circuit is applied to the gate of the transistor M1, and a drain of transistor M1 is connected to the inverting input terminal of the operational amplifier OP1. Moreover, the other input potential VIN2 of the differential inputs of the amplifier circuit is applied to gate of the transistor M2 and drain of transistor M2 is connected to the non-inverting input terminal of the operational amplifier OP1.

Further, the inverting input terminal of the operational amplifier OP1 is connected to the output terminal of the operational amplifier OP1 through resistor R1, and is connected to the output terminal of the operational amplifier OP2 through resistor R3. Further, the inverting input terminal of the operational amplifier OP2 and the non-inverting input terminal of the operational amplifier OP1 are commonly connected, and the commonly connected point is connected to the power supply VC terminal through resistor R2. Furthermore, the inverting input terminal of the operational amplifier OP2 is connected to the output terminal of the operational amplifier OP2 through resistor R4, and voltage VD is applied to the non-inverting input terminal of the operational amplifier OP2. In addition, output VOUT of the positive side of the amplifier circuit of this embodiment is taken out from the output terminal of the operational amplifier OP1. In this example, the output voltage of the negative side is VC.

In the amplifier circuit of the first embodiment, drain voltage VD1 of the MOS transistor M1 and drain voltage VD2 of the MOS transistor M2 are respectively expressed as follows.

$$VD1 = VD2 + VF1 \quad (10)$$

$$VD2 = VD + VF2 \quad (11)$$

In the above equations, VF1, VF2 respectively indicate offset voltages of the operational amplifiers OP1, OP2.

The difference I1A–I2A between current I1A flowing in the MOS transistor M1 and current I2A flowing in the MOS transistor M2 is determined by the following equation.

$$I1A - I2A = 2Kn(VIN1 - VIN2)(VD + VF1 + VF2 - VS) + \quad (12)$$

$$2Kn\left(VIN2 - VT - VD - VF2 - \frac{VF1}{2}\right)VF1$$

Figure 25:
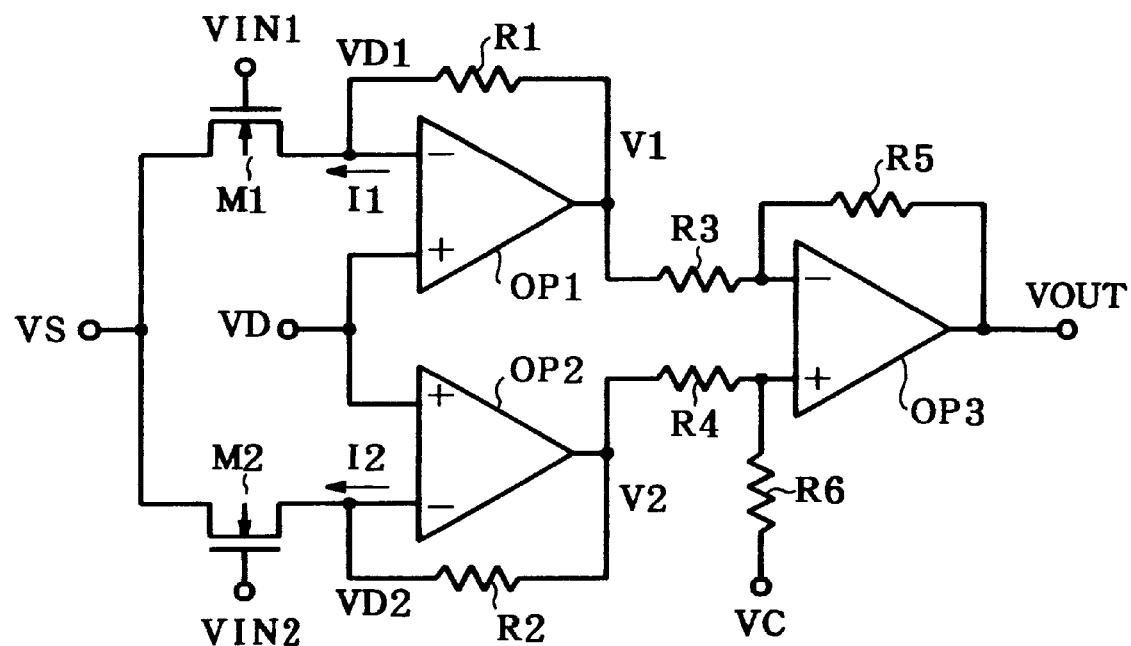
FIG. 25 is a circuit diagram showing the configuration of a conventional amplifier circuit.

The first term of the equation (12) is the term proportional to input voltage, and the second term indicates error. When comparison between the equation (7) and the equation (12) is made, the error is proportional to the difference (VF1−VF2) between the offset voltages in the equation (7), but is proportional to VF1 in the equation (12). Accordingly, when attention is drawn to the case of VF1=−VF2, an error of the amplifier circuit of this embodiment becomes equal to about one half (½) of error of the conventional amplifier circuit shown in FIG. 25. Moreover, in the conventional amplifier circuit, in order to reduce the error, it is necessary to reduce both offset voltages VF1, VF2 of the operational amplifiers OP1, OP2. On the contrary, in the amplifier circuit of this embodiment, it is sufficient to reduce only the offset voltage VF1 of the operational amplifier OP1. Accordingly, it is sufficient to allow only the operational amplifier OP1 to be an operational amplifier of high accuracy.

Further, in the amplifier circuit of this embodiment, if the resistor R3 and the resistor R4 are assumed to have the same resistance value, since potentials VD1, VD2 of the inverting input terminal and the non-inverting input terminal of the operational amplifier OP1 are substantially equal to each other, currents I3, I4 flowing in these resistors R3, R4 are substantially equal to each other. Thus, the current difference I1A–I2A substantially becomes equal to I1–I2. For this reason, assuming that R1=R2=R, amplitude VOUT-VC of output voltage of the amplifier circuit is expressed as follows.

$$VOUT - VC = R(I1 - I2) + VF1 \quad (13)$$

$$= R(I1A - I2A) + VF1$$

$$= 2RKn(VIN1 - VIN2)(VD + VF1 + VF2 - VS) +$$

$$2RKn\left(\frac{1}{2RKn} + VIN2 - VT - VD - VF2 - \frac{VF1}{2}\right)VF1$$

The voltage VC of the negative side of output voltage is constant and output voltage VOUT of the positive side changes with the voltage VC being as center.

When the offset voltages VF1, VF2 are assumed to be expressed as VF1=VF2=0 in the above-mentioned equation (13), the following equation is provided.

$$VOUT-VC = 2RKn(V1N1-V1N2)(VD-VS) \quad (14)$$

Thus, amplitude of the output voltage of the amplifier circuit is proportional to the product of the amplitude (=VIN1−VIN2) of the input voltages VIN1, VIN2 and the voltage across the drain and source (=VD−VS) of the MOS transistors M1, M2.

As has been explained above in accordance with the amplifier circuit of this embodiment, the influence of the offset of the operational amplifier can be reduced. In addition, even if the center value of the input voltage fluctuates, the center value of the output voltage can be constant. Thus, the input dynamic range can be broadened.

Figure 2:
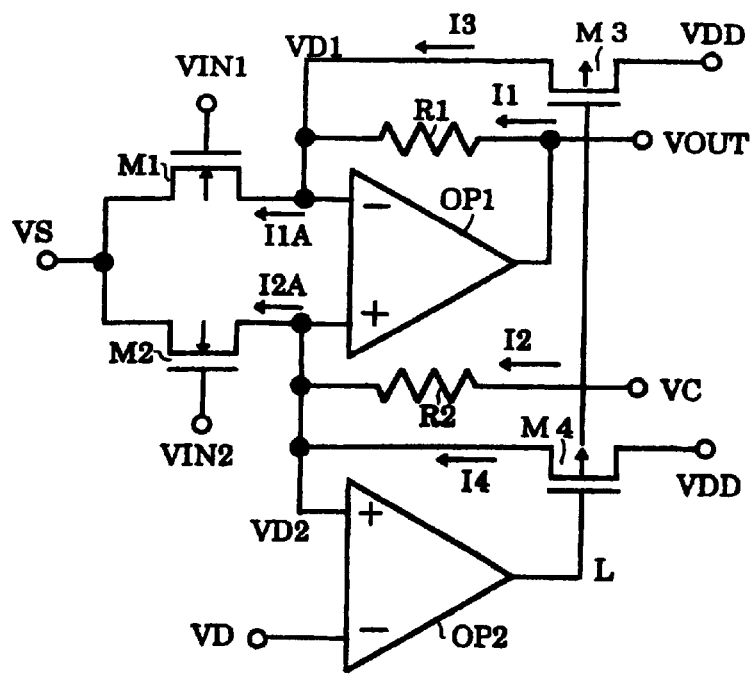
FIG. 2 is a circuit diagram showing the configuration of a second embodiment of an amplifier circuit according to this invention.

The configuration of the second embodiment of the amplifier circuit according to this invention is shown in FIG. 2. The amplifier circuit of this embodiment is characterized in that, in the amplifier circuit of the first embodiment shown in FIG. 1, P-channel MOS transistors M3, M4 are used as the load circuit in place of resistors R3, R4. The drain of the transistor M3 is connected to the inverting input terminal of the operational amplifier OP1, its gate is connected to the output terminal of the operational amplifier OP2, and its source is connected to drive power supply VDD. It is to be noted that, in the second embodiment, the connection relationship between the non-inverting input terminal and the inverting input terminal of the operational amplifier OP2 is opposite to the connection relationship between the non-inverting input terminal and the inverting input terminal of the operational amplifier OP2 in the first embodiment.

Moreover, the drain of the transistor M4 is connected to the non-inverting input terminal of the operational amplifier OP1 and the non-inverting input terminal of the operational amplifier OP2, the gate thereof is connected to the output terminal of the operational amplifier OP2, and drive voltage VDD is applied to the source thereof.

In the amplifier circuit of the second embodiment, since the transistors M3, M4 are operative in the pentode region, even if there is any difference between drain voltages VD1, VD2, it is possible to deliver the same load current. As a result, higher accuracy output voltage can be obtained as compared to the amplifier circuit of the first embodiment.

Figure 3:
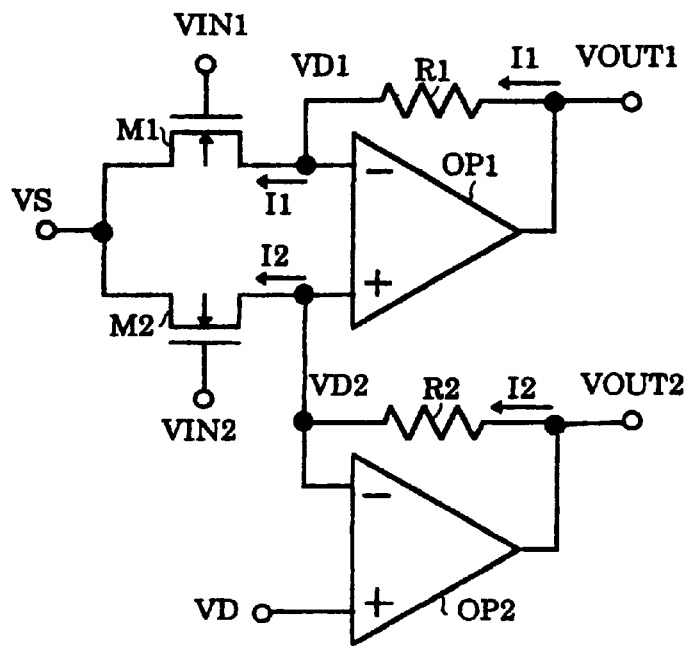
FIG. 3 is a circuit diagram showing the configuration of a third embodiment of an amplifier circuit according to this invention.

The configuration of the third embodiment of the amplifier circuit according to this invention is shown in FIG. 3. The amplifier circuit of this embodiment is characterized in that, in the amplifier circuit of the first embodiment shown in FIG. 1, the resistors R3 and R4 are omitted and the output terminal and the inverting input terminal of the operational amplifier OP2 are connected through the resistor R2.

In the amplifier circuit of the third embodiment, when offset voltages of the operational amplifiers OP1 and OP2 are respectively designated as VF1, VF2, drain voltages VD1, VD2 of the transistors M1, M2 are respectively given, similarly to the first embodiment, by the following equations.

$$VD1 = VD2 + VF1 \quad (10)$$

$$VD2 = VD + VF2 \quad (11)$$

Moreover, output voltages VOUT1, VOUT2 of the operational amplifiers OP1, OP2 are respectively expressed as follows.

$$VOUT1 = VD2 + VF1 + RI11 \quad (15)$$
$$= VD + VF1 + VF2 + 2R1Kn\left\{VIN1 - VT - VS - \frac{(VD + VF1 + VF2 - VS)}{2}\right\}(VD + VF1 + VF2 - VS)$$

$$= VD + VF2 + 2R2Kn\left\{VIN2 - VT - VS - \frac{(VD + VF2 - VS)}{2}\right\}(VD + VF2 - VS) \quad (16)$$

Assuming now that R1=R2=R, difference between output voltages VOUT1 and VOUT2 of the operational amplifiers OP1, OP2 is given as follows.

$$VOUT1 - VOUT2 = 2RKn(VIN1 - VIN2)(VD + VF1 + VF2 - VS) + \quad (17)$$
$$2RKn\left(\frac{1}{2RKn} + VIN2 - VT - VD - VF2 - \frac{VF1}{2}\right)VF1$$

The first term of the equation (17) is an output voltage proportional to the differential input voltage and the second term is an error term. It is seen that since the error increases in proportion to offset voltage VF1, if offset voltage VF1 is reduced, the error can be reduced. Namely, the influence of offset can be reduced. When offset voltages VF1, VF2 are assumed to be zero (0) in the above-mentioned equation (17), the following equation is provided.

$$VOUT1-VOUT2=2RKn(VIN1-VIN2)\ (VD-VS) \quad (18)$$

Thus, amplitude of the output voltage is proportional to a product of the amplitude of the input voltage and the voltage across the drain and source of the MOS transistors M1, M2.

Moreover, assuming that VF1=VF2=0, the center value of output voltage is expressed by the following equation.

$$\frac{VOUT1 + VOUT2}{2} = \quad (19)$$
$$VD + 2RKn\left\{\frac{VIN1 + VIN2}{2} - VT - VS - \frac{(VD - VS)}{2}\right\}(VD - VS)$$

Namely, the center value of output voltage increases in proportion to the center value of input voltage.

Since the amplifier circuit of the third embodiment is of the structure in which its output is in the form of differential outputs, the maximum amplitude of output becomes double as compared to the case of single output as in the amplifier circuit of the second embodiment shown in FIG. 2. However, in the amplifier circuit of the third embodiment, since the center value of the output voltage is proportional to the center value of the input voltage, it is impossible to produce an output amplitude having a large value in the case where the center value of input signal changes. Namely, the dynamic range is small. In order to improve this dynamic range, it is conceivable to additionally provide a load circuit. The amplifier circuit thus proposed will now be described as the fourth embodiment.

Figure 4:
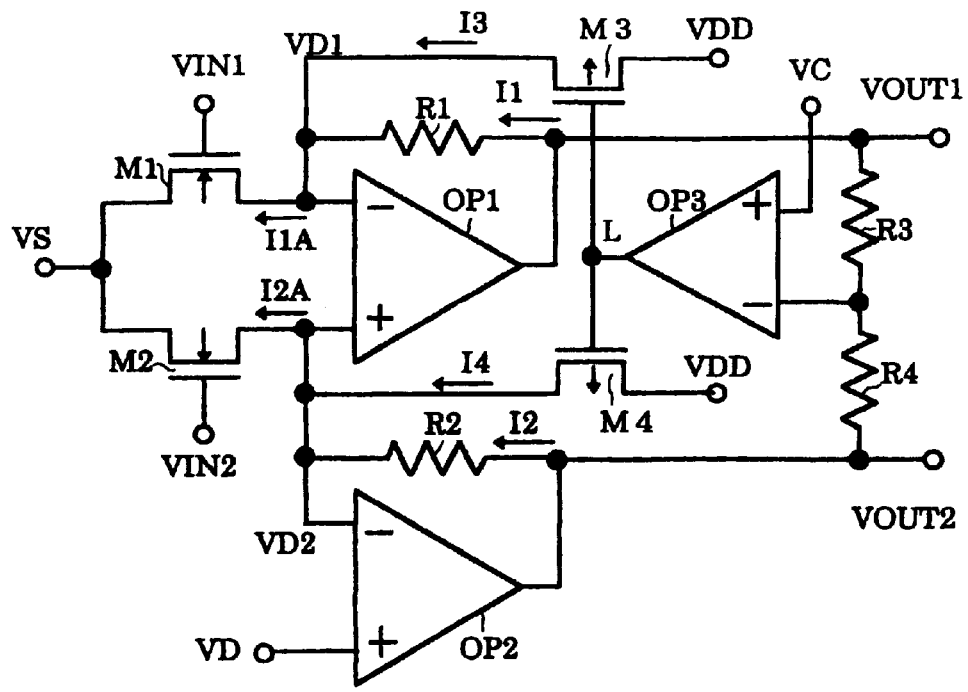
FIG. 4 is a circuit diagram showing the configuration of a fourth embodiment of an amplifier circuit according to this invention.

The configuration of the fourth embodiment of the amplifier circuit according to this invention is shown in FIG. 4. The amplifier circuit of this embodiment is characterized in that P-channel MOS transistors M3, M4, operational amplifier OP3 and resistors R3 and R4 are newly provided in the amplifier circuit of the third embodiment. Drive power supply voltage VDD is applied to the source of the transistor M3, its drain is connected to the inverting input terminal of the operational amplifier OP1, and its gate is connected to the output terminal of the operational amplifier OP3. Moreover, drive power supply voltage VDD is applied to the source of the transistor M4, its drain is connected to the non-inverting input terminal of the operational amplifier OP1, and its gate is connected to the output terminal of the operational amplifier OP3. In addition, reference voltage VC is applied to the non-inverting input terminal of the operational amplifier OP3, and the inverting input terminal thereof is connected to the output terminal of the operational amplifier OP1 through the resistor R3 and is connected to the output terminal of the operational amplifier OP2 through the resistor R4.

In the fourth embodiment, reference voltage VC gives the center value of output voltage of the amplifier circuit. In order to obtain an output voltage with the maximum amplitude, VC is set to VDD/2.

The load MOS transistors M3, M4 operate in the pentode mode, and are caused to be advantageously difficult to be influenced by drain voltages VD1, VD2 of the transistors M1, M2. The resistors R3, R4 serve to obtain the center value of output voltage.

Assuming now that R1=R2=R, offset voltage of the operational amplifier OP1 is designated as VF1, offset voltage of the operational amplifier OP2 is designated as VF2, currents flowing in the transistors M1, M2 are respectively designated as I1A, I2A, and currents flowing in the transistors M3, M4 are respectively designated as I3, I4, the center value of the output voltage can be expressed as follows.

$$VOUT1=VD1+RI1=VD+VF1+VF2+R(I1A-I3) \quad (20)$$
$$VOUT2=VD2+RI2=VD+VF2+R(I2A-I4) \quad (21)$$

$$\frac{VOUT1 + VOUT2}{2} = VD + VF2 + \frac{VF1}{2} + R\left(\frac{I1A + I2A}{2} - \frac{I3 + I4}{2}\right) \quad (22)$$

As seen from equation (22), the center value of the output voltage is proportional to the difference between an average current value of I1A and I2A and an average current value of I3 and I4. Namely, by controlling the load current, it is possible to control the center value of the output voltage.

Accordingly, in the amplifier circuit of the fourth embodiment, the center value of the output voltage is set to reference voltage VC at all times. Further, the amplitude of the output voltage is expressed, from the equations (20), (21) and I3=I4, as follows.

$$VOUT1 - VOUT2 = R(I1A - I2A) + VF1 \quad (23)$$
$$= 2RKn(VIN1 - VIN2)(VD + VF1 + VF2 - VS)$$
$$= 2RKn\left(\frac{1}{2RKn} + VIN2 - VT - VD - VF2 - \frac{VF1}{2}\right)VF1$$

Assuming now that the offset voltage is expressed as VF1=VF2=0, the following equation is provided.

$$VOUT1-VOUT2=2RKn(VIN1-VIN2)\ (VD-VS) \quad (24)$$

Namely, the amplitude of the output voltage is proportional to a product of the amplitude of the input voltage and the voltage across the drain and source of the MOS transistors M1, M2.

As has been explained above, in accordance with the amplifier circuit of this embodiment, the influence of the offset of the operational amplifier is small and the dynamic range is permitted to be as broad as possible.

Figure 5:
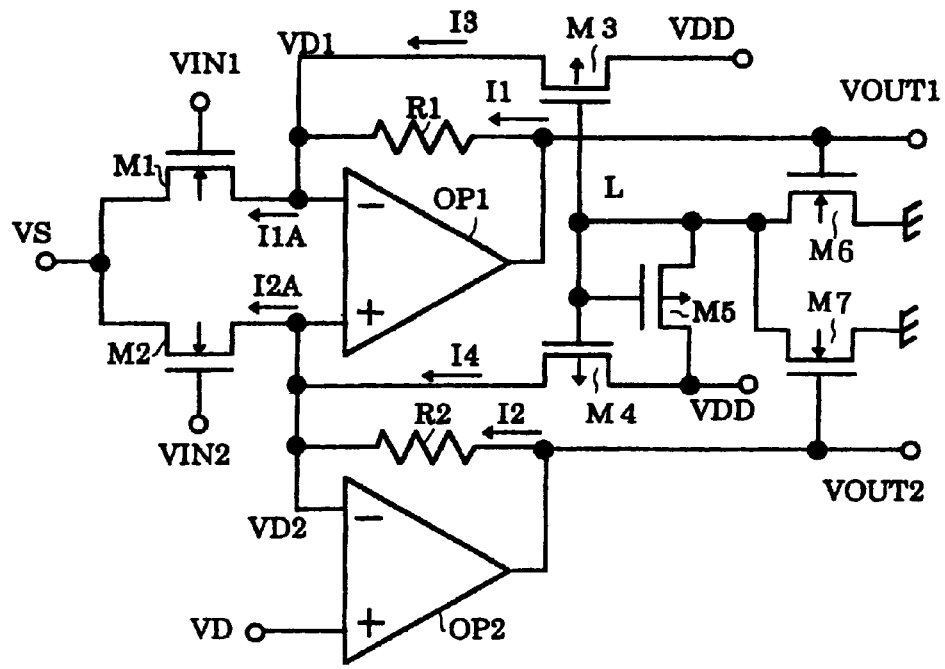
FIG. 5 is a circuit diagram showing the configuration of a fifth embodiment of an amplifier circuit according to this invention.

The configuration of the fifth embodiment of the amplifier circuit according to this invention is shown in FIG. 5. The amplifier circuit of this embodiment is characterized in that P-channel MOS transistor M5 and N-channel MOS transistors M6, M7 are provided in place of the operational amplifier OP3 and the resistors R3, R4 in the amplifier circuit of the fourth embodiment shown in FIG. 4.

The gate and drain of the transistor M5 are commonly connected. The commonly connected point is connected to the gates of the transistors M3 and M4. Drive power supply voltage VDD is applied to the source of the transistor M5. The drain of the transistor M6 is connected to the drain of the transistor M5. The gate of the transistor M6 is connected to the output terminal of the operational amplifier OP1 and the source thereof is connected to the ground power supply. Moreover, the drain of the transistor M7 is connected to the drain of the transistor M5, its gate is connected to the output terminal of the operational amplifier OP2, and its source is connected to the ground power supply.

In the amplifier circuit of the fifth embodiment, output voltages VOUT1, VOUT2 are inputted to the load circuit through NOR circuit composed of MOS transistors M5, M6, M7 to control the load current. However, the center value of the output voltage is not constant as in the case of the fourth embodiment shown in FIG. 4. The amplitude of the output voltage is expressed by the equation (23) similarly to the amplifier circuit of the fourth embodiment.

By controlling the load current by the output voltage in this way, fluctuation of the center value of the output voltage is suppressed, thus making it possible to broaden the dynamic range.

Figure 6:
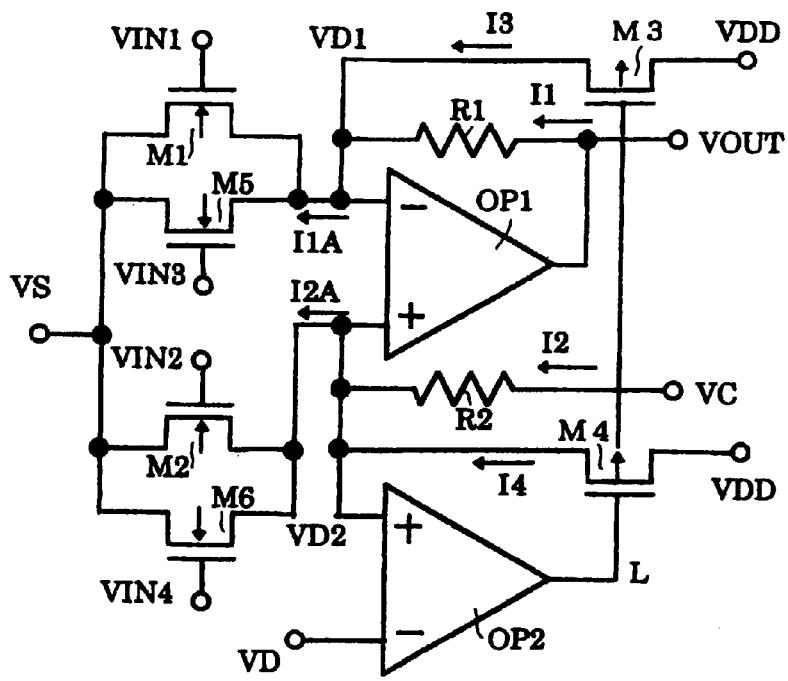
FIG. 6 is a circuit diagram showing the configuration of a sixth embodiment of an amplifier circuit according to this invention.

The configuration of the sixth embodiment of the amplifier circuit according to this invention is shown in FIG. 6. The amplifier circuit of this embodiment is characterized in that N-channel MOS transistors M5, M6 are newly provided in the amplifier circuit of the second embodiment shown in FIG. 2.

The transistor M5 is connected in parallel with the transistor M1 and the transistor M6 is connected in parallel with the transistor M2. It is now assumed that the transistors M5, M6 are to be manufactured so as to have the same characteristics as that of the transistors M1, M2.

The operation of the sixth embodiment will be described below. The drain current I1A of the transistors M1, M5, the drain current I2A of the transistors M2, M6 and the difference current therebetween are expressed as follows.

$$I1A=2Kn\{VIN1+VIN3-2VS-2VT-(VD+VF1+VF2-VS)\}(VD+VF1+VF2-VS) \quad (25)$$

$$I2A=2Kn\{VIN2+VIN4-2VS-2VT-(VD+VF2VS)\}(VD+VF2-VS) \quad (26)$$

$$I1A-I2A=2Kn\{(VIN1-VIN2)-(VIN4-VIN3)\}(VD+VF1+VF2-VS)+2Kn\{VIN2+VIN4-2(VT+VD)-(2VF2+VF1)\}VF1 \quad (27)$$

Here, when, for brevity, offset voltages VF1, VF2 of the operational amplifiers OP1, OP2 are assumed to be zero, R1 and R2 are assumed to be R and load currents I3, 14 are assumed to be equal to each other, the output voltage is expressed as described below.

$$I1A-I2A=I1-I2 \quad (28)$$

$$VOUT-VC=R(I1-I2)=2RKn\{(VIN1-VIN2)-(VIN4-VIN3)\}(VD-VS) \quad (29)$$

It is seen that the amplitude of the output voltage is proportional to the difference between two differential input voltages from equation (29). Moreover, equation (29) is the definition equation of DDA (Differential Difference Amplifier). It is seen that the amplifier circuit of the sixth embodiment shown in FIG. 6 is operative as a DDA.

It is a matter of course that the amplifier circuit of the sixth embodiment permits the influence of offset to be small and permits the dynamic range to be broad.

Figure 7:
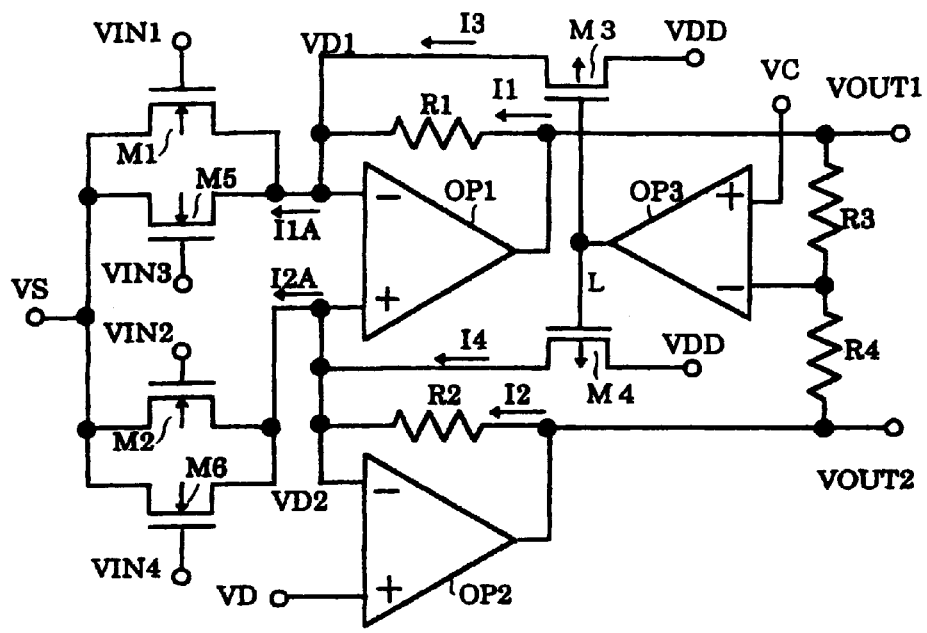
FIG. 7 is a circuit diagram showing the configuration of a seventh embodiment of an amplifier circuit according to this invention.

The configuration of the seventh embodiment of an amplifier circuit according to this invention is shown in FIG. 7. The amplifier circuit of this embodiment is characterized in that, in the amplifier circuit of the fourth embodiment shown in FIG. 4, N-channel MOS transistors M5, M6 having the same characteristics as that of the MOS transistors M1, M2 are newly provided, the MOS transistor M5 is connected in parallel with the MOS transistor M1, and the MOS transistor M6 is connected in parallel with the MOS transistor M2. Accordingly, the amplifier circuit of the seventh embodiment is also operative as a DDA which outputs a differential output voltage proportional to a difference between two differential input voltages similarly to the amplifier circuit of the sixth embodiment. Namely, if R1=R2=R and I3=I4, the differential output voltage can be expressed as follows.

$$I1A - I2A = I1 - I2 \quad (30)$$

$$VOUT1 - VOUT2 = R(I1 - I2) + VF1 \quad (31)$$
$$= 2RKn\{(VIN1 - VIN2) - (VIN4 - VIN3)\}(VD + VF1 + VF2 - VS) + 2RKn\left\{\frac{1}{2RKn} + VIN2 + VIN4 - 2(VT + VD) - (2VF2 + VF1)\right\}VF1$$

The amplifier circuit of the seventh embodiment can also produce an output amplitude with a large value similarly to the amplifier circuit of the fourth embodiment. Moreover, the second term of the equation (31) represents an error. In this case, if the offset voltage VF1 of the operational amplifier OP1 is reduced, error can be reduced. When offset voltages VF1, VF2 are assumed to be zero, the output voltage can be expressed as follows.

$$VOUT1-VOUT2=2RKn\{(VIN1-VIN2)-(VIN4-VIN3)\}(VD-VS) \quad (32)$$

From this, it is seen that the amplifier circuit of the seventh embodiment is also operative as a DDA.

Figure 8:
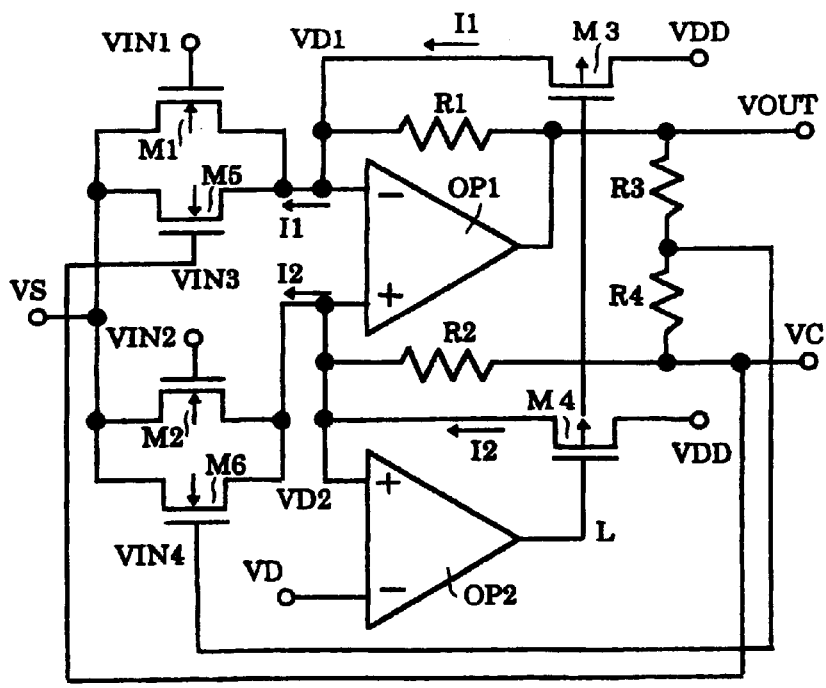
FIG. 8 is a circuit diagram showing the configuration of an eighth embodiment of an amplifier circuit according to this invention.

The configuration of the eighth embodiment of the amplifier circuit according to this invention is shown in FIG. 8. The amplifier circuit of this embodiment is characterized in that, in the amplifier circuit of the sixth embodiment shown in FIG. 6, the output is voltage-divided by resistors R3, R4 to provide negative feedback of the divided voltage back to the second differential input terminals VIN4, VIN3, i.e., gates of the MOS transistors M6, M5.

Between the gate voltage VIN4 of the MOS transistor M6 and gate voltage VIN3 of the MOS transistor M5, there exists the relationship as indicated below.

$$VIN4 - VIN3 = \frac{R4}{R3 + R4}(VOUT - VC) \quad (33)$$

When substitution of the equation (33) into the equation (29) is made, the following relational expression holds between the output voltage and the input voltage.

$$VOUT - VC = \frac{1}{\left\{\frac{1}{2RKn(VD-VS)} + \frac{R4}{R3+R4}\right\}} \cdot (VIN1 - VIN2) \quad (34)$$

Here, further, in the case where value of resistance R (=R1=R2) is sufficiently large (R=∞), the following relationship holds between the output voltage and the input voltage.

$$VOUT - VC = \frac{R3+R4}{R4}(VIN1 - VIN2) \quad (35)$$

Thus, the amplifier circuit of the eighth embodiment is operative as an instrumentation amplifier such that in the case where resistance R is sufficiently large, the influence of offset can be reduced and the dynamic range can be widened.

Figure 9:
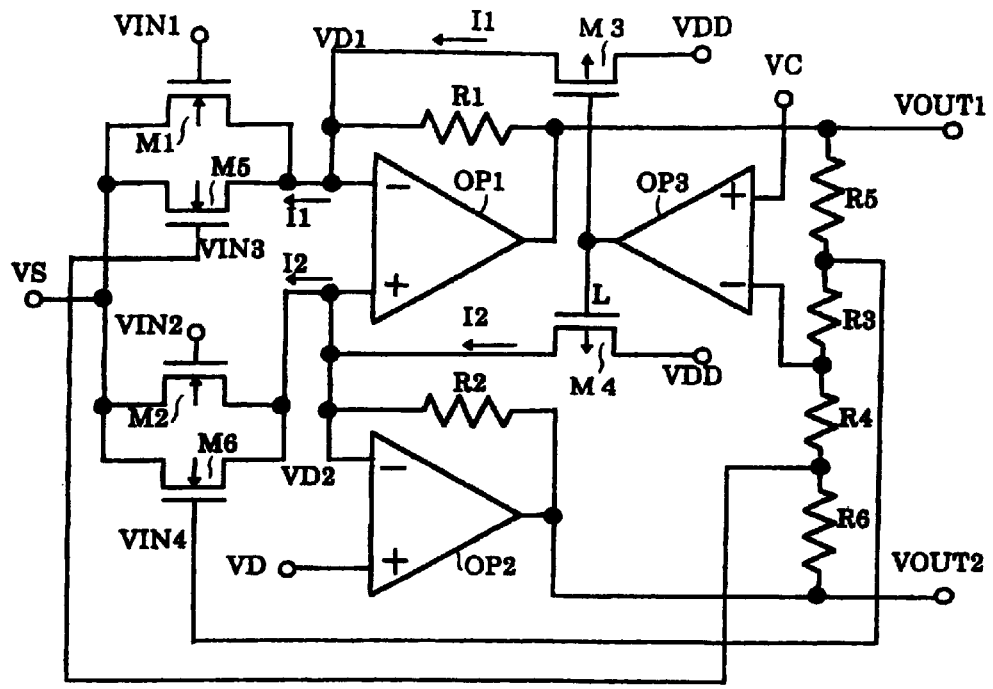
FIG. 9 is a circuit diagram showing the configuration of a ninth embodiment of an amplifier circuit according to this invention.

The configuration of the ninth embodiment of the amplifier circuit according to this invention is shown in FIG. 9. The amplifier circuit of this embodiment is characterized in that, in the seventh embodiment shown in FIG. 7, the output is voltage-divided by resistors R3, R4, R5, R6 to provide negative feedback of the divided voltages back to the second differential input terminals VIN4, VIN3.

Between gate voltage VIN4 of the MOS transistor M6 and gate voltage VIN5 of the MOS transistor M5, there exists the following relationship.

$$VIN4 - VIN3 = \frac{R3+R4}{R3+R4+R5+R6}(VOUT1 - VOUT2) \quad (36)$$

When substitution of the equation (36) into the equation (29) is made, the followiNG relational expression holds between the output voltage and the input voltage.

$$VOUT1 - VOUT2 = \quad (37)$$

$$\frac{1}{\left\{\frac{1}{2RKn(VD-VS)} + \frac{R3+R4}{R3+R4+R5+R6}\right\}} \cdot (VIN1 - VIN2)$$

Further, in the case where value of the resistance R is sufficiently great (R=∞), the following relationship holds between the output voltage and the input voltage.

$$VOUT1 - VOUT2 = \frac{R3+R4+R5+R6}{R3+R4}(VIN1 - VIN2) \quad (38)$$

Thus, the amplifier circuit of the ninth embodiment is operative as an instrumentation amplifier such that in the case where value of resistance R (=R1=R2) is sufficiently great, the influence of offset can be reduced and the dynamic range can be widened.

Figure 10:
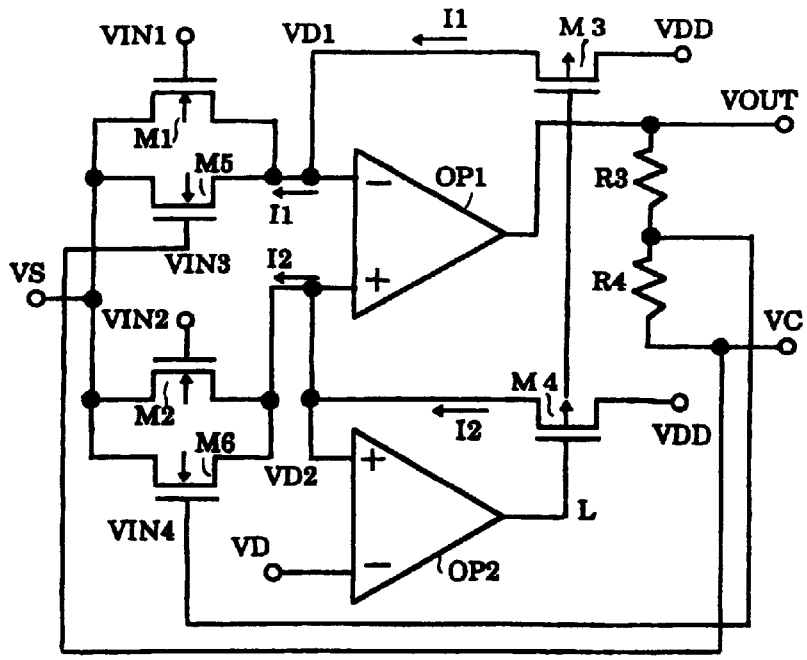
FIG. 10 is a circuit diagram showing the configuration of a tenth embodiment of an amplifier circuit according to this invention.

The configuration of the tenth embodiment of the amplifier circuit according to this invention is shown in FIG. 10. This amplifier circuit of this embodiment is characterized in that, in the amplifier circuit of the sixth embodiment shown in FIG. 6, the resistors R1, R2 are omitted and output of the amplifier circuit is voltage-divided by resistors R3, R4 to provide negative feedback of the divided voltage back to the second differential input terminals VIN4, VIN3. Accordingly, the amplifier circuit of the tenth embodiment is directed to the amplifier circuit in which values of the resistors R1, R2 are caused to be greatly large (R=∞) in the amplifier circuit of the eighth embodiment shown in FIG. 8.

Also in this embodiment, the relationship of equation (35) holds as previously described.

Thus, the amplifier circuit of the tenth embodiment is operative as an instrumentation amplifier in which the influence of offset can be reduced and the dynamic range can be broadened.

The configuration of the eleventh embodiment of the amplifier circuit according to this invention is shown in FIG. 1. The amplifier circuit of this embodiment is directed to the amplifier circuit that values of the resistors R1, R2 are caused to be very large in the amplifier circuit of the ninth embodiment shown in FIG. 9. As has been already described in the ninth embodiment, the amplifier circuit of the eleventh embodiment is also operative as an instrumentation amplifier.

Figure 12:
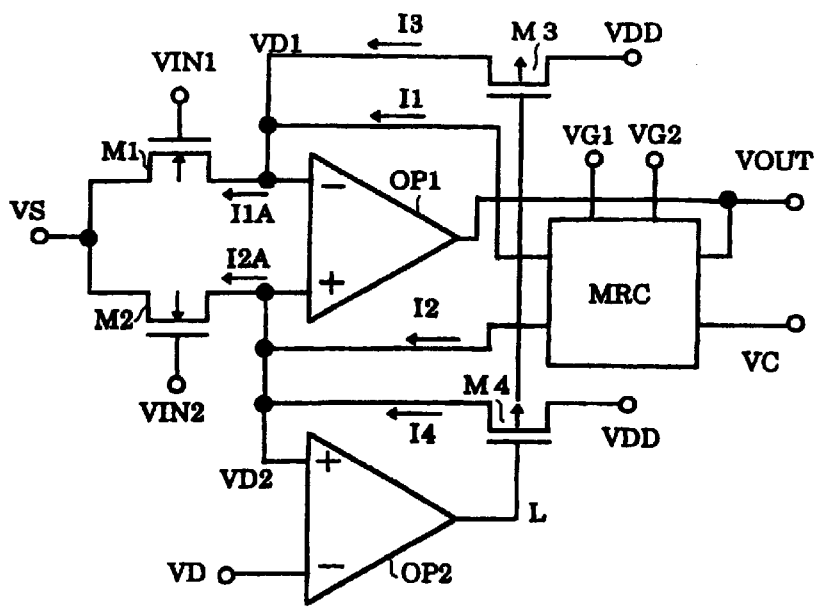
FIG. 12 is a circuit diagram showing the configuration of a twelfth embodiment of an amplifier circuit according to this invention.
Figure 13:
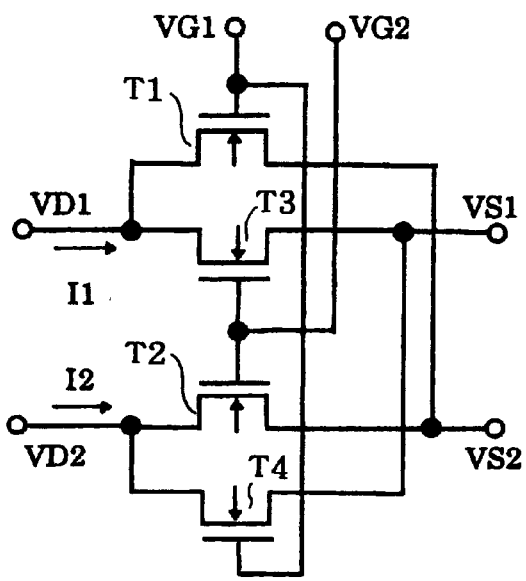
FIG. 13 is a circuit diagram showing a more practical example of an MRC used in this invention.

The configuration of the twelfth embodiment of the amplifier circuit according to this invention is shown in FIG. 12. This amplifier circuit of the twelfth embodiment is directed to the amplifier circuit in which the resistors R1, R2 are replaced by an MRC (MOS Resistive Circuit) in the amplifier circuit of the second embodiment shown in FIG. 2. A more practical example of this MRC is shown in FIG. 13. As seen from FIG. 13, this MRC of the more practical example includes N-channel MOS transistors T1, T2, T3, T4. Moreover, voltage VD1 is applied to drains of the transistors T1, T3, and voltage VD2 is applied to drains of the transistors T2, T4. Further, sources of the transistor T1 and the transistor T2 are commonly connected and source voltage VS2 is applied to the commonly connected point. Sources of the transistor T3 and the transistor T4 are commonly connected and source voltage VS1 is applied to the commonly connected point. In addition, gates of the transistor Ti and the transistor T4 are commonly connected and gate voltage VG1 is applied to the commonly connected point, and gates of the transistor T2 and the transistor T3 are commonly connected and gate voltage VG2 is applied to the commonly connected point.

When VD1=VD2 in FIG. 13, the following relationship holds.

$$VS1 - VS2 = \frac{(I1 - I2)}{2Kn(VG1 - VG2)} \quad (39)$$

Accordingly, the equivalent resistance R of the MRC is expressed as follows.

$$R = \frac{1}{2Kn(VG1 - VG2)} \quad (40)$$

If such an MRC is used, high-resistance can be constituted by the MOS transistor. This is more suitable for integration of the amplifier circuit. The detail of the MRC is disclosed in U.S. Pat. No. 4,710,726.

It is a matter of course that the amplifier circuit of the twelfth embodiment also provides advantages similar to the amplifier circuit of the second embodiment.

Figure 14:
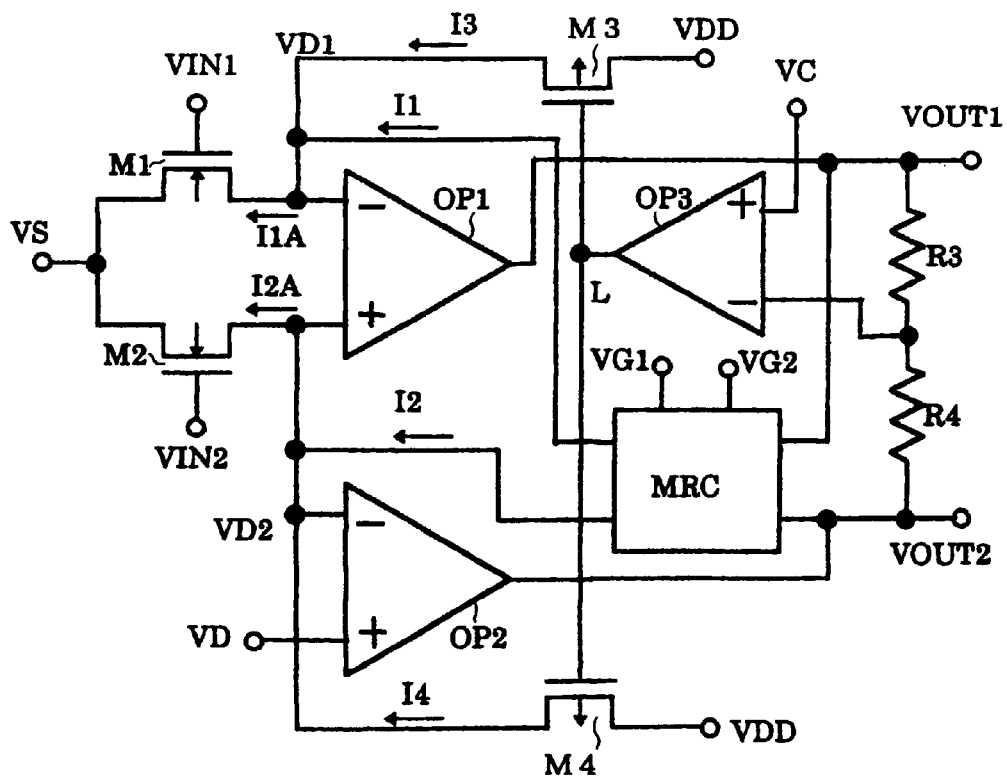
FIG. 14 is a circuit diagram showing the configuration of a thirteenth embodiment of an amplifier circuit according to this invention.

The configuration of the thirteenth embodiment of the amplifier circuit according to this invention is shown in FIG. 14. The amplifier circuit of this embodiment is the amplifier circuit in which the resistors R1, R2 are replaced by an MRC in the amplifier circuit of the fourth embodiment shown in FIG. 4.

The amplifier circuit of the thirteenth embodiment provides advantages similar to those of the amplifier circuit of the fourth embodiment, and is more suitable for integration as the result of the fact that the resistors R1, R2 are replaced by an MRC.

Figure 15:
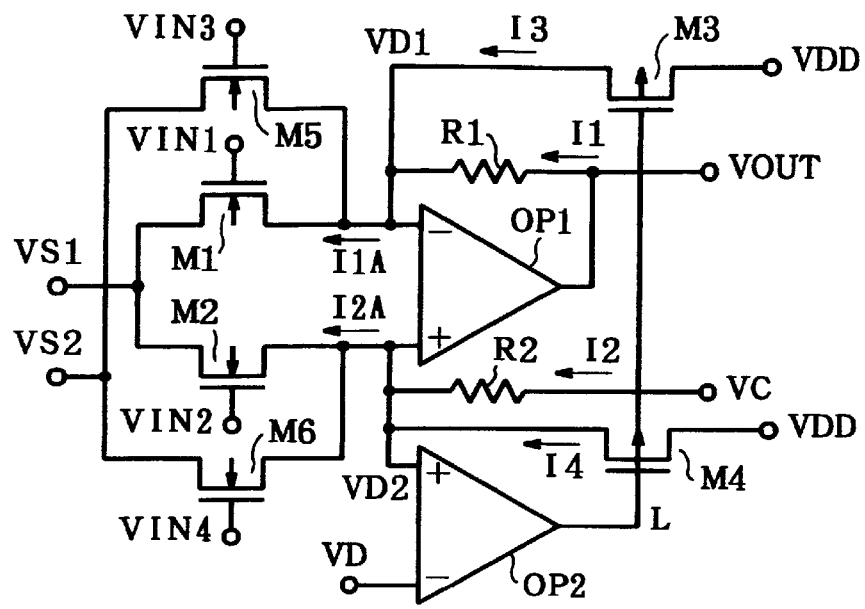
FIG. 15 is a circuit diagram showing the configuration of a fourteenth embodiment of an amplifier circuit according to this invention.

The configuration of the fourteenth embodiment of the amplifier circuit according to this invention is shown in FIG. 15.

The amplifier circuit of the fourteenth embodiment is directed to the amplifier circuit in which N-channel MOS transistors M5, M6 and power supply VS2 are newly provided in the amplifier circuit of the second embodiment shown in FIG. 2.

The transistors M5, M6 are adapted so that their sources are commonly connected to the power supply VS2, the drain of the transistor M5 is connected to the drain of the transistor M1, and the drain of the transistor M6 is connected to the drain of the transistor M2. In this example, the transistors M5, M6 are assumed to have the same characteristic. In addition, the transistors M1, M2 are called the first MOS transistor pair and the transistors M5, M6 are called the second MOS transistor pair. First differential input voltages (VIN1, VIN2) are respectively applied to gates of the first MOS transistor pair, and second differential input voltages (VIN3, VIN4) are respectively applied to gates of the second MOS transistor pair.

The operation of the fourteenth embodiment will be described below. In this embodiment, between input voltages VIN1, VIN2, VIN3, VIN4 and currents I1A, I2A, the following relationship exists.

$$i1A = \qquad (41)$$
$$2Kn\left\{VIN1 - VS1 - VT - \frac{1}{2}(VD + VF1 + VF2 - VS1)\right\}(VD + VF1 +$$
$$VF2 - VS1) + 2Kn\left\{VIN3 - VS2 - VT -\right.$$
$$\left.\frac{1}{2}(VD + VF1 + VF2 - VS2)\right\}(VD + VF1 + VF2 - VS2)$$

$$I2A = \qquad (42)$$
$$2Kn\left\{VIN2 - VS1 - VT - \frac{1}{2}(VD + VF2 - VS1)\right\}(VD + VF2 - VS1) +$$
$$2Kn\left\{VIN4 - VS2 - VT - \frac{1}{2}(VD + VF2 - VS2)\right\}(VD + VF2 - VS2)$$

$$I1A - I2A = 2Kn(VIN1 - VIN2)VD + VF1 + VF2 - VS1) + \qquad (43)$$
$$2Kn\left(VIN2 - VT - VD - \frac{1}{2}VF1 - VF2\right)VF1 +$$
$$2Kn(VIN3 - VIN4)(VD + VF1 + VF2 - VS2) +$$
$$2Kn\left(VIN4 - VT - VD - \frac{1}{2}VF1 - VF2\right)VF1$$

When offset voltages VF1, VF2 of the operational amplifiers OP1, OP2 are assumed to be respectively zero for simplicity, the following relationship holds.

$$I1A-I2A=2Kn\{(VIN1-VIN2)(VD-VS1)+(VIN3-VIN4)(VD-VS2)\} \qquad (44)$$

Further, when R1 and R2 are assumed to be R and load currents I3, I4 are assumed to be equal to each other, output voltage (VOUT-VC) can be expressed by the following equation.

$$VOUT - VC = R(I1 - I2) \qquad (45)$$
$$= R(I1A - I2A)$$
$$= 2KnR[(VIN1 - VIN2)(VD - VS1) +$$
$$(VIN3 - VIN4)(VD - VS2)]$$

Namely, it is seen that the amplifier circuit of the fourteenth embodiment shown in FIG. 15 is operative as a sum of product circuit which outputs a voltage proportional to the sum of the product of differential input voltages applied to respective gates of two sets of MOS transistor pairs and voltages across the drain and source of the respective sets of MOS transistor pairs.

Figure 16:
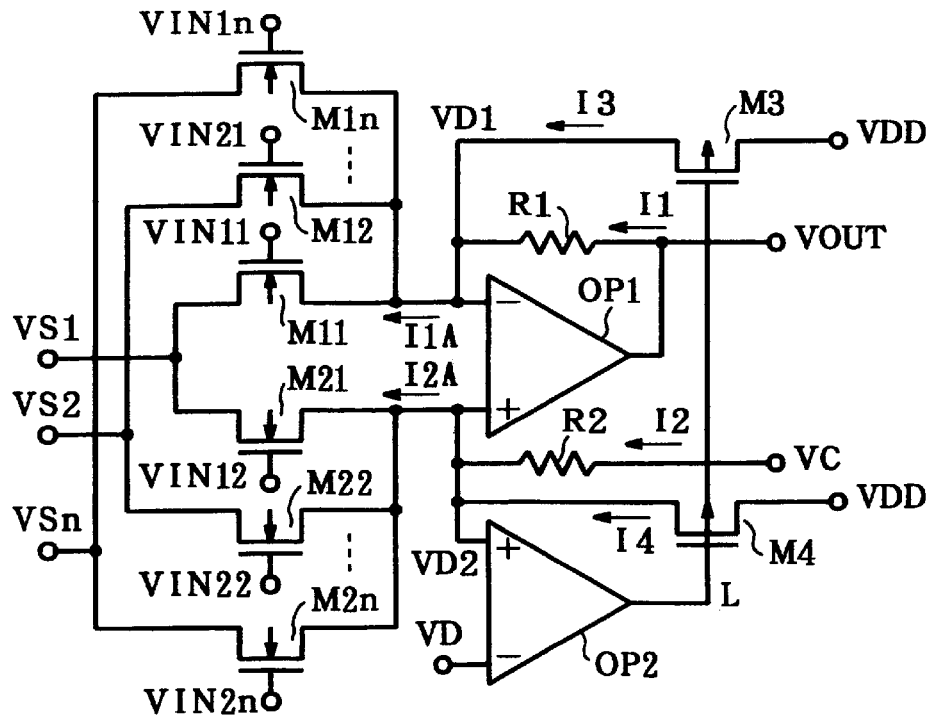
FIG. 16 is a circuit diagram showing the configuration of a fifteenth embodiment of an amplifier circuit according to this invention.

The configuration of the fifteenth embodiment of the amplifier circuit according to this invention is shown in FIG. 16.

The amplifier circuit of the fifteenth embodiment is directed to the amplifier circuit in which two sets of MOS transistor pairs constituted by N-channel MOS transistors (M1, M2), (M5, M6) are replaced by n sets of MOS transistors constituted by N-channel MOS transistors (M11, M21), (M11, M22), . . . ,(M1n, M2n) in the amplifier circuit of the fourteenth embodiment shown in FIG. 15 to expand the function. When it is now assumed for simplicity that offset voltages VF1, VF2 of the operational amplifiers OP1, OP2 are equal to zero (0), values of the resistors R1, R2 are equal to R and load currents I3, I4 are equal to each other, output voltage of the amplifier circuit of the fifteenth embodiment shown in FIG. 16 is expressed by the following equation.

$$VOUT - VC = 2KnR\sum_{i=1}^{n}(VIN1i - VIN2i)(VD - VSi) \qquad (46)$$

Namely, the amplifier circuit of the fifteenth embodiment shown in FIG. 16 is operative as a sum of product circuit which outputs a voltage proportional to the sum of the product of n sets of differential input voltages applied to gates of respective sets of MOS transistor pairs and voltages across the drain and source of respective sets of MOS transistor pairs.

Figure 17:
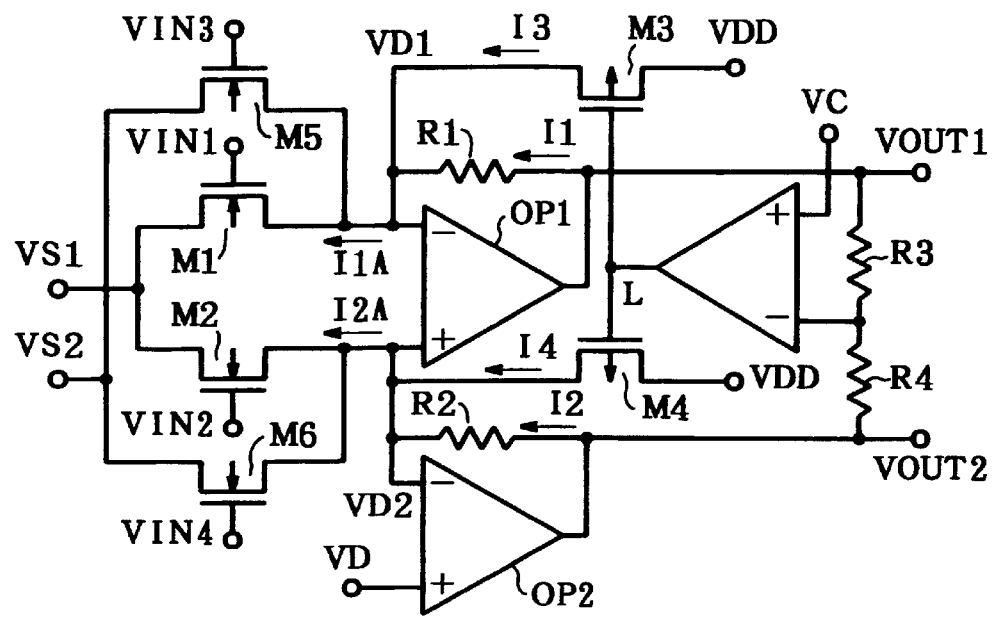
FIG. 17 is a circuit diagram showing the configuration of a sixteenth embodiment of an amplifier circuit according to this invention.

The configuration of the sixteenth embodiment of the amplifier circuit according to this invention is shown in FIG. 17.

The amplifier circuit of the sixteenth embodiment is characterized in that N-channel MOS transistors M5, M6 and power supply VS2 are newly provided in the amplifier circuit of the fourth embodiment shown in FIG. 4.

The transistors M5, M6 are adapted so that their sources are commonly connected to the power supply VS2, the drain of the transistor M5 is connected to the drain of the transistor M1, and the drain of the transistor M6 is connected to the drain of the transistor M2. In this example, the transistors MS, M6 are assumed to have the same characteristics. In addition, the transistors M1, M2 are called the first MOS transistor pair, and the transistors M5, M6 are called the second MOS transistor pair. First differential input voltages (VIN1, VIN2) are applied to gates of the first MOS transistor pair and second differential input voltages (VIN3, VIN4) are applied to gates of the second MOS transistor pair.

The operation of the sixteenth embodiment will now be described.

Between input voltages VIN1, VIN2, VIN3, VIN4 and currents I1A, I2A, the relationship expressed as the equations (41), (42), (43) holds.

Assuming now that, for simplicity, offset voltages VF1, VF2 of the operational amplifiers OP1, OP2 are caused to be respectively zero (0), values of resistors R1, R2 are caused to be R and load currents I3, I4 are equal to each other, output voltage is expressed by the following equation.

$$VOUT1 - VOUT2 = R(I1 - I2) \quad (47)$$
$$= R(I1A - I2A)$$
$$= 2KnR[(VI1 - VI2)(VD - VS1) +$$
$$(VIN3 - VIN4)(VD - VS2)]$$

Namely, the amplifier circuit of the sixteenth embodiment shown in FIG. 17 is operative as a sum of product circuit which outputs a voltage proportional to the sum of the product of differential input voltages applied to gates of respective sets of MOS transistor pairs and voltages across the drain and source of respective sets of MOS transistor pairs.

Figure 18:
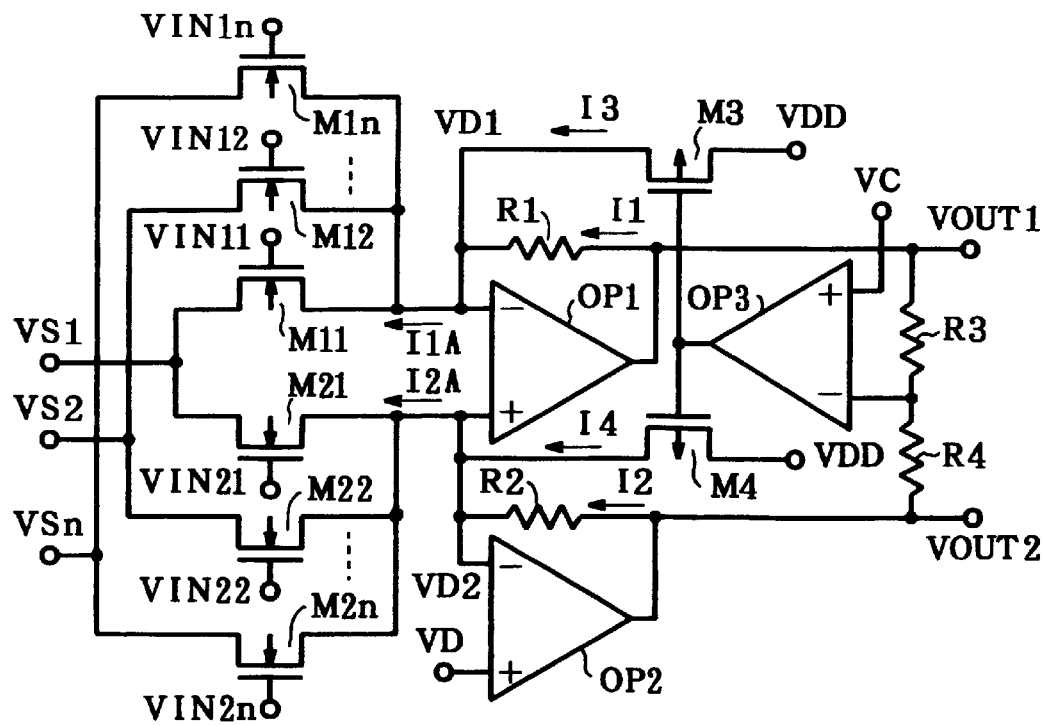
FIG. 18 is a circuit diagram showing the configuration of a seventeenth embodiment of an amplifier circuit according to this invention.

The configuration of the seventeenth embodiment of the amplifier circuit according to this invention is shown in FIG. 18.

The amplifier circuit of the seventeenth embodiment is characterized in that, in the amplifier circuit of the sixteenth embodiment shown in FIG. 17, two sets of MOS transistor pairs constituted by N-channel MOS transistors (M1, M2), (M5, M6) are replaced by n sets of MOS transistors constituted by N-channel MOS transistors (M11, M21), (M11, M22), ..., (M1n, M2n) to expand the function.

Assuming that, for simplicity, offset voltages VF1, VF2 of the operational amplifiers OP1, OP2 are caused to be zero (0), values of the resistors R1, R2 are equal to R and load currents I3, I4 are equal to each other, the output voltage of the amplifier circuit of the seventeenth embodiment shown in FIG. 18 is expressed by the following equation.

$$VOUT1 - VOUT2 = 2KnR \sum_{i=1}^{n} (VIN1i - VIN2i)(VD - VSi) \quad (48)$$

Namely, the amplifier circuit of the seventeenth embodiment shown in FIG. 18 is operative as a sum of product circuit which outputs a voltage proportional to the sum of the product of n sets of differential input voltages applied to gates of respective sets of MOS transistor pairs and voltages across the drain and source of respective sets of MOS transistor pairs.

Figure 19:
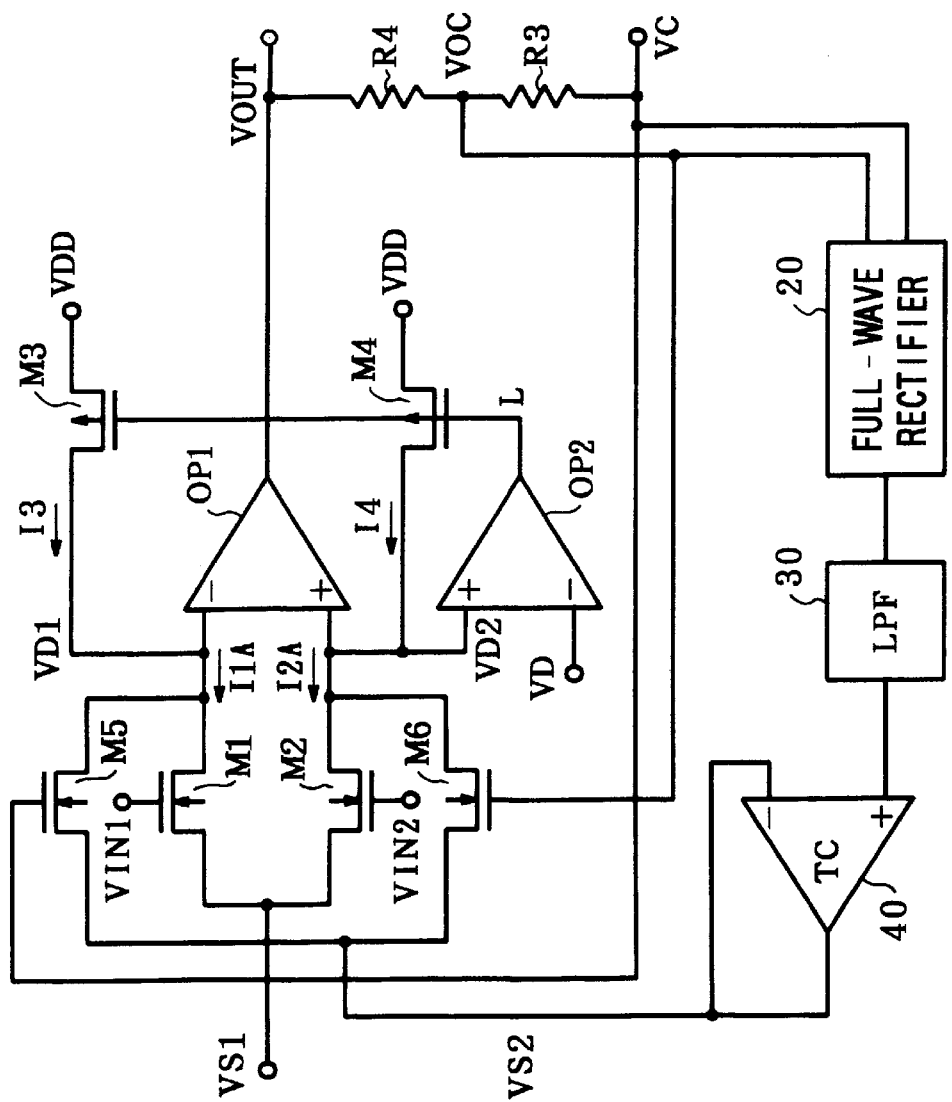
FIG. 19 is a circuit diagram showing the configuration of an eighteenth embodiment of an amplifier circuit according to this invention.

The configuration of the eighteenth embodiment of the amplifier circuit according to this invention is shown in FIG. 19.

The amplifier circuit of the eighteenth embodiment is characterized in that, in the amplifier circuit of the fourteenth embodiment shown in FIG. 15, the resistors R1, R2 are omitted, and a voltage dividing circuit composed of resistors R3, R4, a full-wave rectifying circuit 20, a low-pass filter 30 and a transconductance circuit 40 are newly provided.

In the eighteenth embodiment, the output voltage (=VOUT–VC) is divided by the above-mentioned voltage dividing circuit. Further, the divided output voltage (=VOC–VC) is applied across gates of the second MOS transistor pair M5, M6 and respective potentials VOC, VC which provide the divided output voltage are caused to undergo full-wave rectification by the fall-wave rectifying circuit 20. Output of the fall-wave rectifying circuit 20 is inputted to sources of the second MOS transistor pair M5, M6 through the low-pass filter 30 and the transconductance circuit 40.

It is now assumed that source voltage VS2 of the second MOS transistor pair M5, M6 is lower than reference voltage VD at all times. Thus, the relationship between VD and VS2 is expressed as follows.

$$VD - VS2 = \frac{R3}{R3 + R4} |VOUT - VC| \quad (49)$$

On the other hand, since the right side of the equation (45) is equal to zero in the steady state, the following equations can be obtained from the equation (45) and the equation (49).

$$(VIN1 - VIN2)(VD - VS1) - \quad (50)$$
$$\left(\frac{R3}{R3 + R4}\right)^2 |VOUT - VC|(VOUT - VC) = 0$$

$$VOUT - VC = \frac{R3 + R4}{R3} \frac{VIN1 - VIN2}{|VIN1 - VIN2|} \sqrt{|VIN1 - VIN2|(VD - VS1)} \quad (51)$$

Thus, it is seen that the amplifier circuit of the eighteenth embodiment shown in FIG. 19 functions as a compressor circuit in which the amplitude of the output voltage is proportional to the square root of the amplitude of the input voltage.

Figure 20:
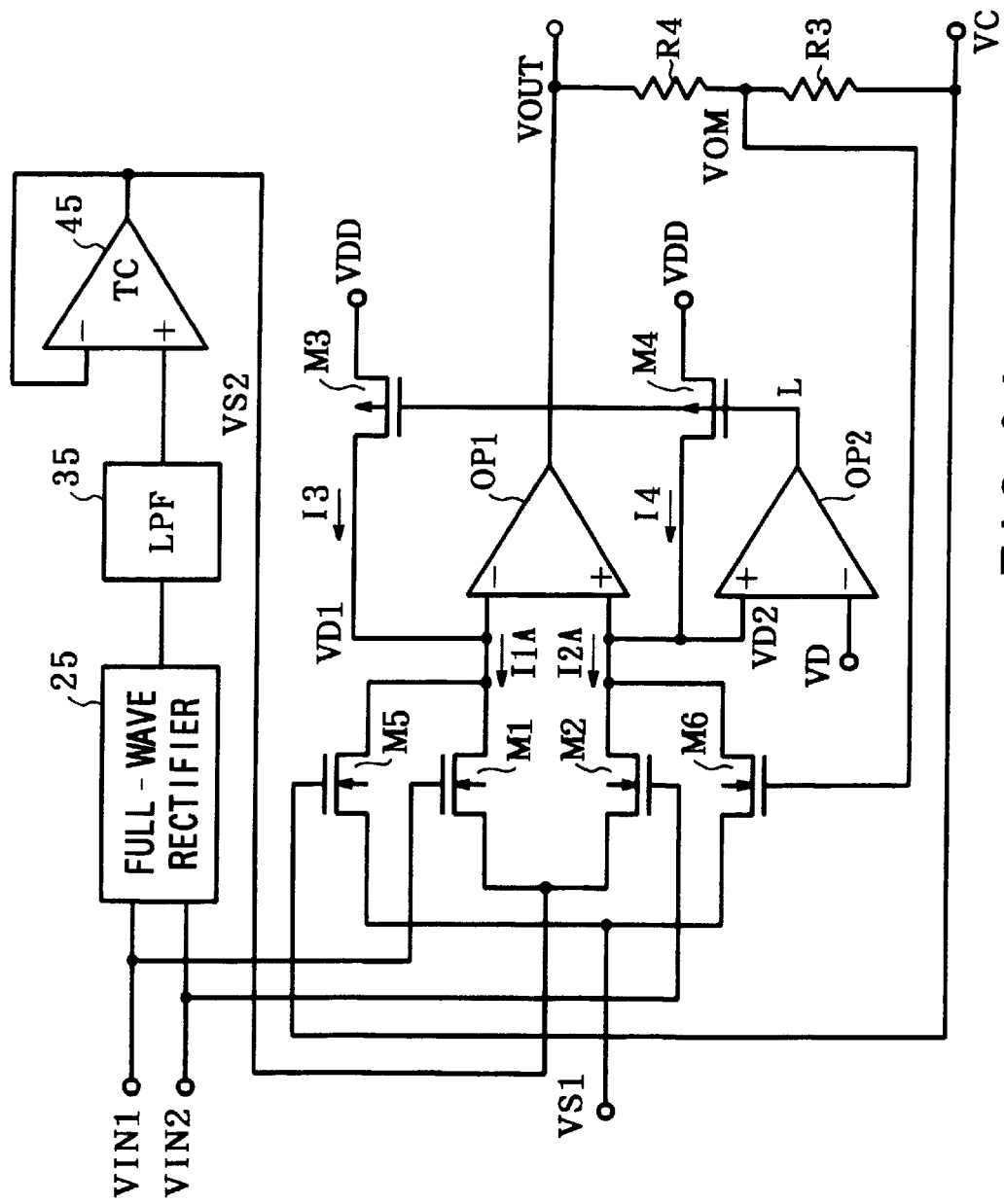
FIG. 20 is a circuit diagram showing the configuration of a nineteenth embodiment of an amplifier circuit according to this invention.

The configuration of the nineteenth embodiment of the amplifier circuit according to this invention is shown in FIG. 20.

The amplifier circuit of the nineteenth embodiment is characterized in that, in the amplifier circuit of the fourteenth embodiment shown in FIG. 15, the resistors R1, R2 are omitted, and a voltage dividing circuit composed of dividing circuit composed of resistors R3, R4, a full-wave rectifying circuit 25, a low-pass filter 35 and a transconductance circuit 45 are newly provided.

In this nineteenth embodiment, the output voltage (=VOUT–VC) of the amplifier circuit of the fourteenth embodiment is divided by the voltage dividing circuit. Further, this divided output voltage (=VOM–VC) is applied across the gates of the second MOS transistors M5, M6. Moreover, differential input voltages VIN1, VIN2 are caused to undergo full-wave rectification by the full-wave rectifying circuit 25. The output of the full-wave rectifying circuit 25 is waveform-shaped and is phase-adjusted by the low-pass filter 35. The output of the low-pass filter 35 is the source voltage VS2 of the first MOS transistor pair M1, M2 through the transconductance circuit 45.

It is now assumed that the source voltage VS2 of the first MOS transistor pair M1, M2 is lower than reference voltage VD at all times. Thus, in the state where the amplifier circuit of the nineteenth embodiment is stable, the following equations hold.

$$VD - VS2 = |VIN1 - VIN2| \quad (52)$$

$$(VOUT - VC) = \frac{R3 + R4}{R3} \frac{(VIN1 - VIN2)}{|VIN1 - VIN2|} \frac{(VIN1 - VIN2)^2}{(VD - VS)} \quad (53)$$

Namely, it is seen that the circuit of the nineteenth embodiment shown in FIG. 20 functions as an expander circuit in which the amplitude of the output voltage is proportional to the square of the amplitude of the input voltage.

Figure 21:
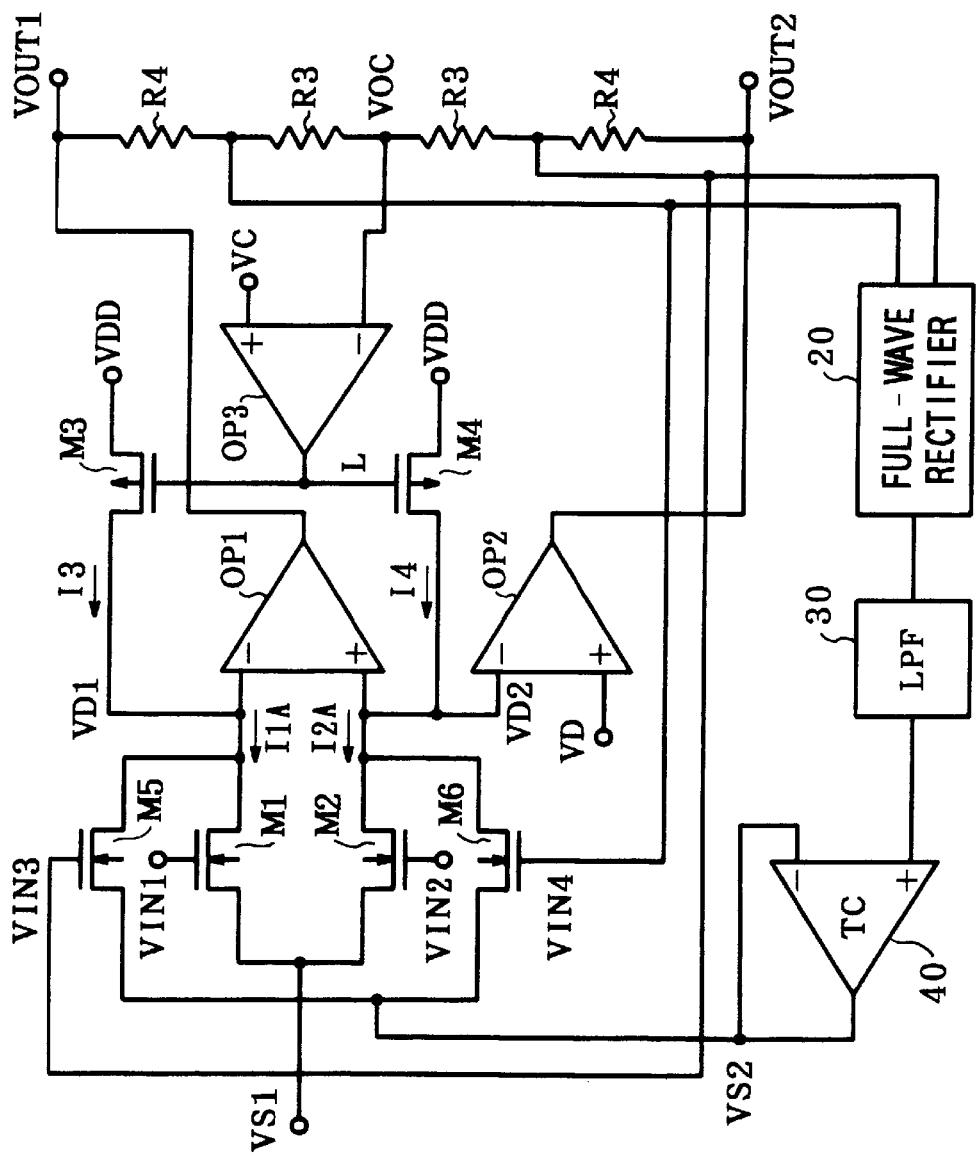
FIG. 21 is a circuit diagram showing the configuration of a twentieth embodiment of an amplifier circuit according to this invention.

The configuration of the twentieth embodiment of the amplifier circuit according to this invention is shown in FIG. 21.

The amplifier circuit of the twentieth embodiment is characterized in that, in the amplifier circuit of the sixteenth embodiment shown in FIG. 17, the resistors R1, R2 are omitted, and a first voltage dividing circuit composed of resistors R4, R3, which divides voltage between output voltage VOUT1 and voltage of the inverting input terminal of the operational amplifier OP3, a second voltage dividing circuit composed of resistors R3, R4, which divides voltage between voltage of the inverting input terminal of the operational amplifier OP3 and output voltage VOUT2, fall-wave rectifying circuit 20, low-pass filter 30 and transconductance circuit 40 are newly provided.

In this amplifier circuit of the twentieth embodiment, voltages divided by the first and second voltage dividing circuits are respectively applied to gates of the MOS transistors M6, M5, and are sent to the full-wave rectifying circuit 20, to undergo full-wave rectification. The output of this full-wave rectifying circuit 20 is waveform-shaped and is phase-adjusted by the low-pass filter 30. The output of the low-pass filter 30 is inputted to the sources of the second MOS transistor pair M5, M6 through the transconductance circuit 40.

It is now assumed that source voltage VS2 of the second MOS transistor pair M5, M6 is lower than reference voltage VD at all times.

Thus, between VD and VS2, the following equation holds.

$$VD - VS2 = \frac{R3}{R3 + R4}|VOUT1 - VOUT2| \tag{54}$$

Since the right side of the equation (47) becomes equal to zero when the amplifier circuit of the twentieth embodiment is in a stable state, the following equation holds from the equation (47) and the equation (54).

$$(VIN1 - VIN2)(VD - VS1) - \tag{55}$$
$$\left(\frac{R3}{R3 + R4}\right)WUP2|VOUT1 - VOUT2|(VOUT1 - VOUT2) = 0$$

$$(VOUT1 - VOUT2) = \tag{56}$$
$$\frac{R3 + R4}{R3} \frac{(VIN1 - VIN2)}{|VIN1 - VIN2|}\sqrt{|VIN1 - VIN2|(VD - VS1)}$$

Namely, it is seen that the circuit of the twentieth embodiment shown in FIG. 21 functions as a compressor circuit in which the amplitude of the output voltage is proportional to the square root of the amplitude of the input voltage.

Figure 22:
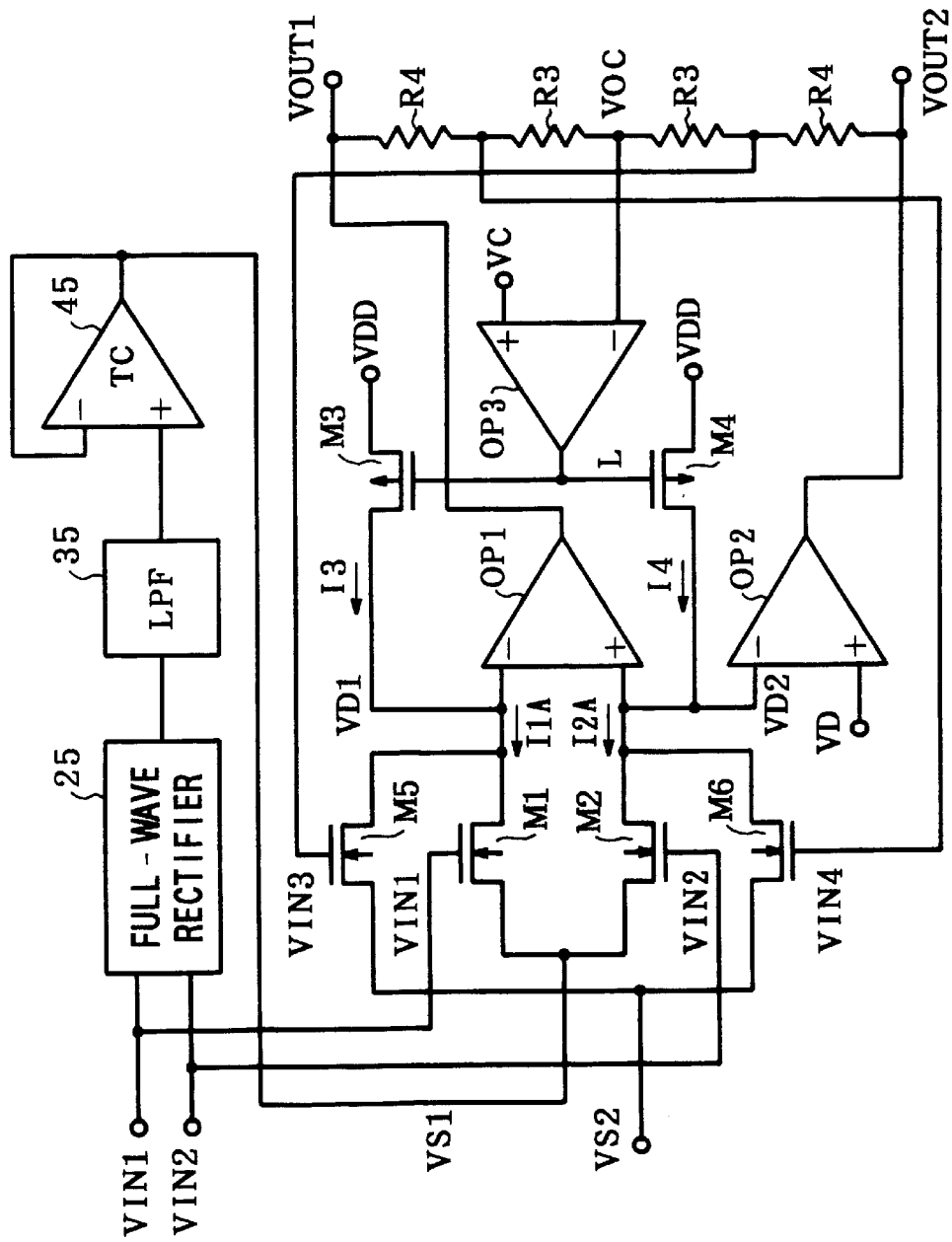
FIG. 22 is a circuit diagram showing the configuration of a twenty-first embodiment of an amplifier circuit according to this invention.

The configuration of the twenty-first embodiment of the amplifier circuit according to this invention is shown in FIG. 22.

This amplifier circuit of the twenty-first embodiment is characterized in that, in the amplifier circuit of the twentieth embodiment shown in FIG. 21, full-wave rectifying circuit 25, low-pass filter 35 and transconductance circuit 45 are respectively provided in place of the full-wave rectifying circuit 20, the low-pass filter 30 and the transconductance circuit 40.

Differential input voltages VIN1, VIN2 are caused to undergo fall-wave rectification by the fall-wave rectifying circuit 25. The output of this full-wave rectifying circuit 25 is waveform-shaped and is phase-adjusted by the low-pass filter 35. Further, the output of this low-pass filter 35 is inputted as source voltage VS1 of MOS transistor pair M1, M2 through the transconductance circuit 45.

When it is now assumed that source voltage VS1 of the MOS transistors M1, M2 is lower than reference voltage VD at all times and the amplifier circuit of the twenty-first embodiment is in a stable state, the following equations hold.

$$VD - VS1 = |VIN1 - VIN2| \tag{57}$$

$$(VOUT1 - VOUT2) = \frac{R3 + R4}{R3}\frac{(VIN1 - VIN2)}{|VIN1 - VIN2|}\frac{(VIN1 - VIN2)^2}{(VD - VS)} \tag{58}$$

Namely, it is seen that the circuit of the twenty-first embodiment shown in FIG. 22 is operative as an expander circuit in which the amplitude of the output voltage is proportional to the square of the differential input voltage.

Figure 23:
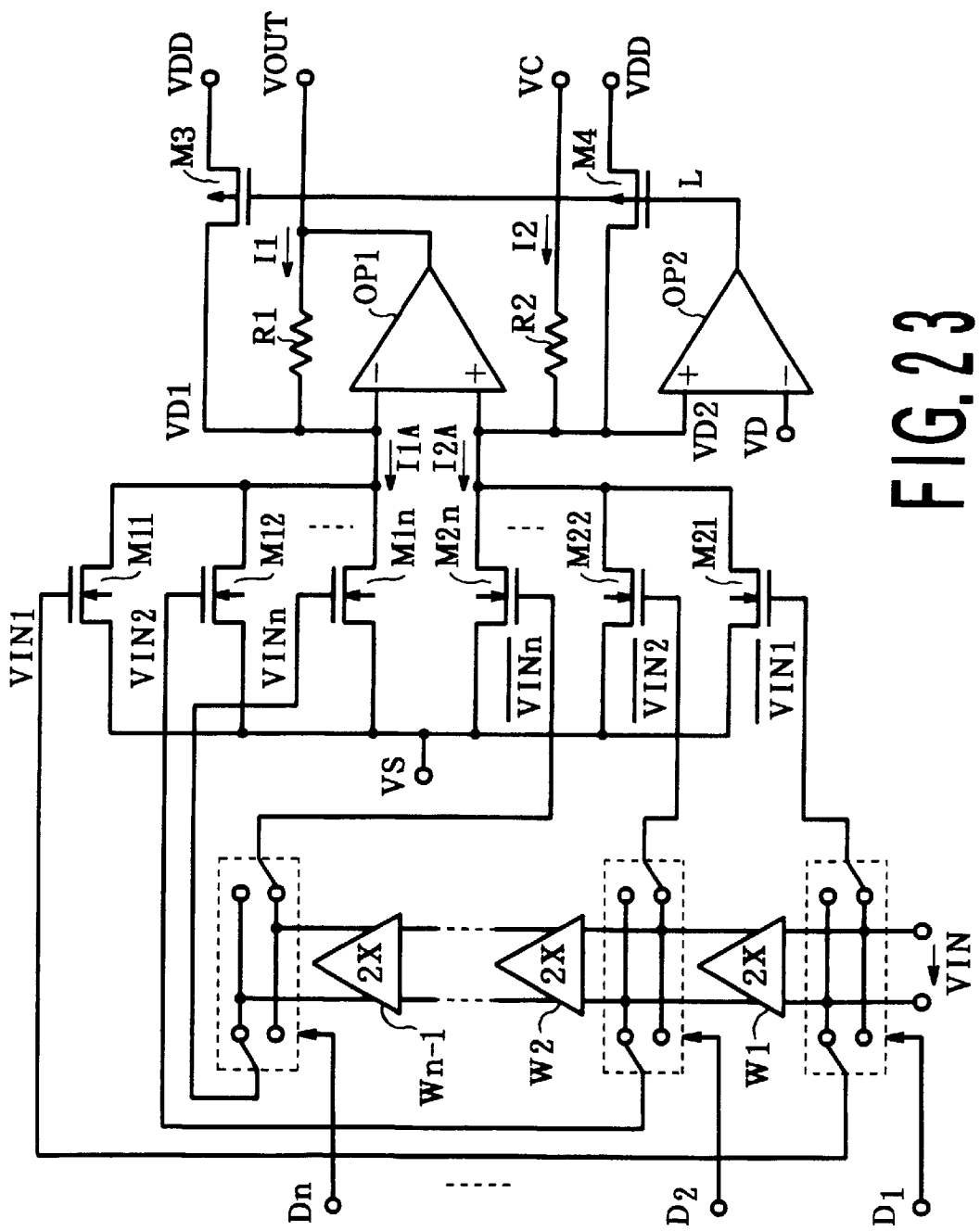
FIG. 23 is a circuit diagram showing the configuration of a twenty-second embodiment of an amplifier circuit according to this invention.

The configuration of the twenty-second embodiment of the amplifier circuit according to this invention is shown in FIG. 23.

The circuit of the twenty-second embodiment is characterized in that, in the amplifier circuit of the fifteenth embodiment shown in FIG. 16, (n-1) number of voltage amplifiers W1 to Wn-1 each having an amplification factor of 2 are provided, and source terminals of the first, the second . . . and the n-th MOS transistor pairs are commonly connected to further apply the i-th differential input voltages VIN1 (i=1, . . . n) of n number of differential input voltages VIN1 to VINn corresponding to digital data D of n bits to gates of the i-th MOS transistor pairs. In this case, D and VIN1 are expressed by the following equations.

$$D = \sum_{i=1}^{n} D_i \cdot 2^{i-1} \tag{59}$$

$$VINi = \left(D_i - \frac{1}{2}\right) \cdot VIN \cdot 2^i \tag{60}$$

The output voltage of the circuit of the twenty-second embodiment is expressed by the following equation (61) from the equation (46).

$$VOUT - VC = 2KnR \cdot (VD - VS) \cdot VIN \sum_{i=1}^{n} (D_i \cdot 2^i - 2^{i-1}) \tag{61}$$

Namely, it is seen that the circuit of the twenty-second embodiment shown in FIG. 23 is operative as a D/A converter.

Figure 24:
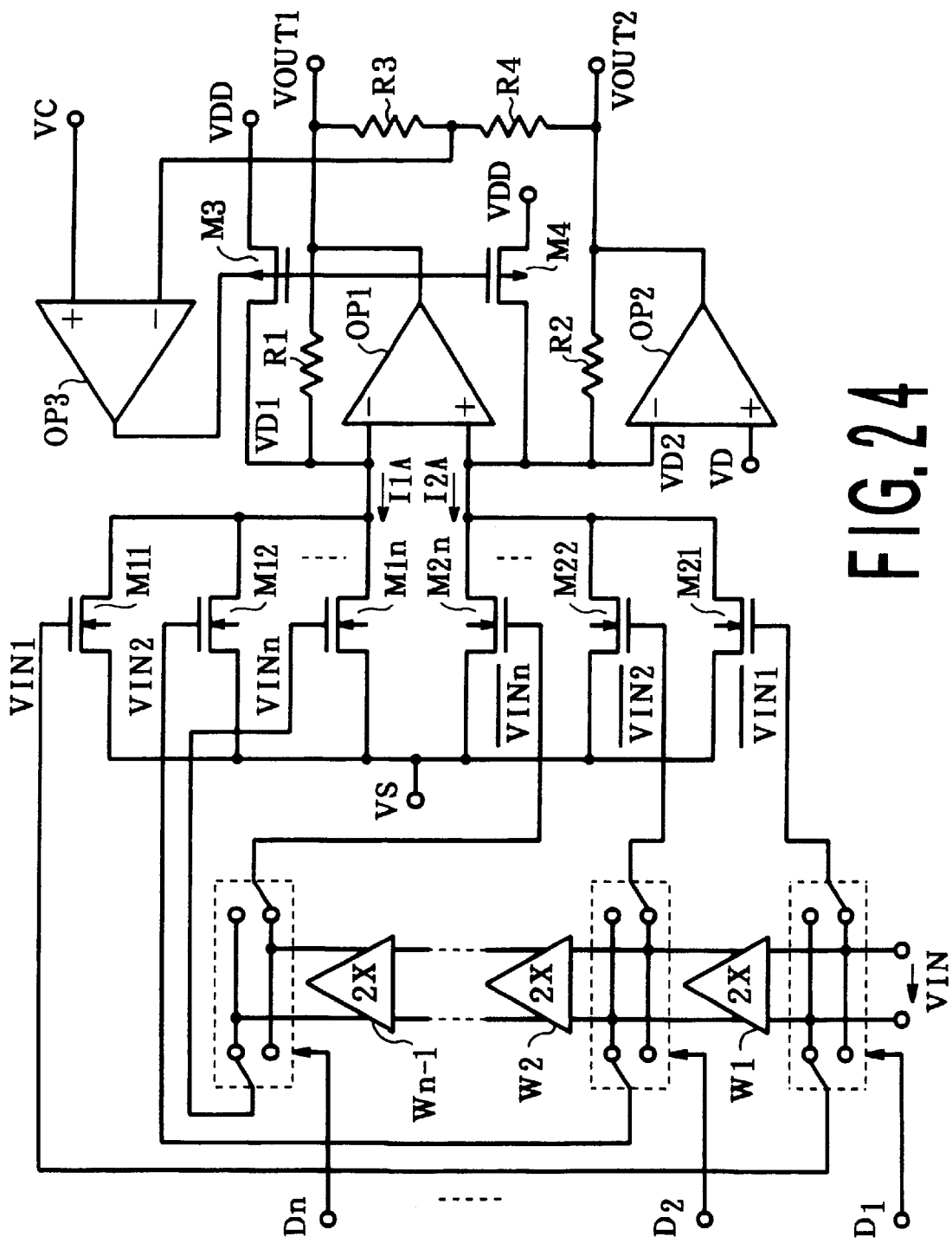
FIG. 24 is a circuit diagram showing the configuration of a twenty-third embodiment of an amplifier circuit according to this invention.

The configuration of the twenty-third embodiment of the amplifier circuit according to this invention is shown in FIG. 24.

The circuit of the twenty-third embodiment is characterized in that, in the circuit of the seventeenth embodiment shown in FIG. 18, (n-1) number of voltage amplifiers W1 to Wn-1 each having an amplification factor of 2 are provided, and source terminals of the first, the second, . . . , and the n-th MOS transistor pairs are commonly connected to apply the i-th differential input voltages VIN1 of n number of differential input voltages VIN1 to VINn corresponding to digital data D of n bits to gates of the i-th MOS transistor pairs. In this example, digital data D and the i-th differential input voltage VIN1 are respectively expressed by the equation (59) and the equation (60).

The output voltage of the circuit of the twenty-third embodiment is expressed by the following equation from the equation (48).

$$VOUT1 - VOUT2 = 2KnR \cdot VIN \cdot (VD - VS) \sum_{i=1}^{n} (D_i \cdot 2^i - 2^{i-1}) \quad (62)$$

Thus, it is seen that the circuit of the twenty-third embodiment is operative as a D/A converter.

Figure 11:
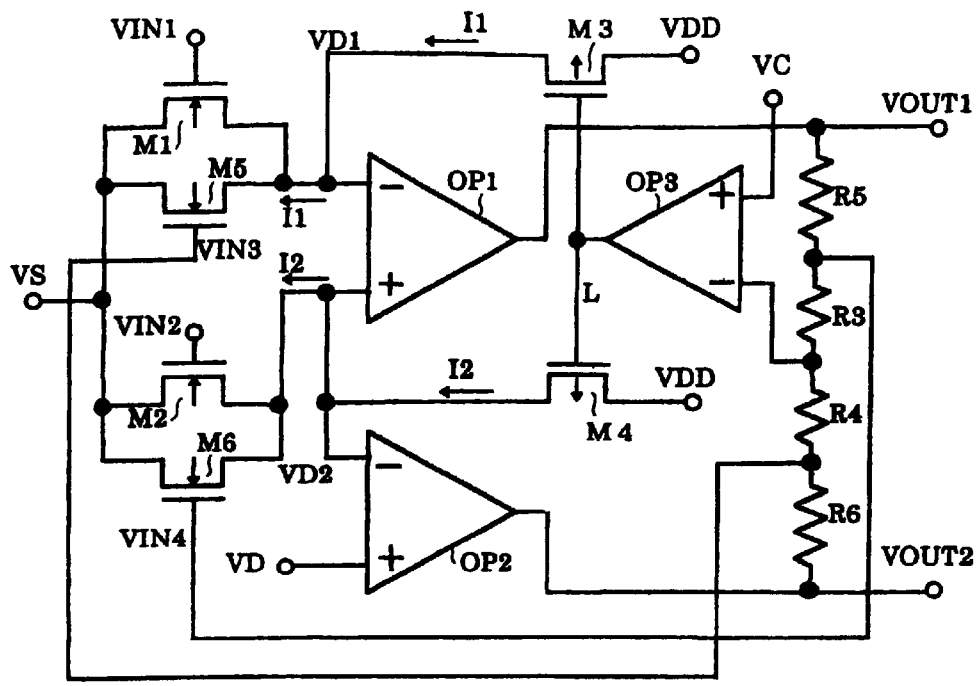
FIG. 11 is a circuit diagram showing the configuration of an eleventh embodiment of an amplifier circuit according to this invention.

Since the circuits of the twenty-second embodiment and the twenty-third embodiment shown in FIGS. 23, 24 use fewer resistors as compared to the resistance dividing type D/A converter, these circuits are circuits suitable for an integrated circuit. Moreover, there may be employed a configuration in which, e.g., as in the case of the amplifier circuits shown in FIGS. 10 and 11, resistors R1, R2 are omitted and a divided voltage of the output voltage is applied across the gates of the MOS transistors M5, M6, or there may be employed a configuration in which, as in the case of the circuits shown in FIGS. 12 and 13, resistors R1, R2 are replaced by an MRC.

Moreover, in general, the characteristics of the MOS transistor can vary compared to the resistor. Particularly, it is difficult to control the threshold value of the MOS transistor and variations thereof are large. For this reason it is considered that an error of a D/A converter using an MOS transistor in place of a resistor is large. However, as described below, the D/A converter according to this invention is not influenced by the threshold value of the MOS transistor.

It is now assumed that, e.g., currents flowing in MOS transistor pair (M1I, M2i) corresponding to the i-th bit are respectively designated as I1i, I2i and threshold voltages of the MOS transistors are respectively designated as Vth1i, Vth2i.

A difference $\Delta I_i$ between differential current $I_{i1}$ in the case where data Di of the i-th bit is "1" and differential current $I_{iO}$ in the case where Di is "0" is expressed as follows.

$$I_{i1} = (I1i - I2i)_{Di=1} \quad (63)$$
$$= 2KnVIN \cdot 2^{i-1} \cdot \left\{ 2\left(1 - \frac{1}{2}\right) + (Vth1i - Vth2i)\right\}(VD - VS)$$

$$I_{iO} = (I1i - I2i)_{Di=0} \quad (64)$$
$$= 2KnVIN \cdot 2^{i-1} \cdot \left\{ 2\left(0 - \frac{1}{2}\right) + (Vth1i - Vth2i)\right\}(VD - VS)$$

$$\Delta I_i = I_{i1} - I_{iO} = 4KnVIN \cdot 2^{i-1} \cdot (VD - VS) \quad (65)$$

It is seen from the equation (65) that the difference between differential currents is irrelevant to the threshold voltage of the respective MOS transistors. When the output voltage in the case where values of Di of respective digits are all "0" is assumed to be VO, the output voltage VOUT is expressed by the following equation.

$$VOUT - VO = 4RKnVIN(VD - VS) \sum_{i=1}^{n} D^i 2^{i-1} \quad (66)$$

Namely, it is seen that the output voltage VOUT–VO of the circuits of the twenty-second embodiment and the twenty-third embodiment are not influenced by variations of the threshold voltage of the MOS transistor.

As described above, in accordance with this invention, the influence of offset can be reduced and the dynamic range is permitted to be as broad as possible.

What is claimed is:

1. A single output differential amplifier circuit comprising:

first and second MOS transistors of a first conductivity type in which their characteristics are substantially the same, their sources being commonly connected to a first power supply;

a first operational amplifier having an inverting input terminal connected to a drain of the first MOS transistor and a non-inverting input terminal connected to a drain of the second MOS transistor;

a second operational amplifier having two input terminals such that one input terminal is connected to the drain of the second MOS transistor and the other input terminal is connected to a second power supply;

a first resistance circuit provided between the drain of the first MOS transistor and an output terminal of the first operational amplifier;

a second resistance circuit having substantially the same resistance value as that of the first resistance circuit provided between the drain of the second MOS transistor and a third power supply;

a first load circuit for delivering a load current to the drain of the first MOS transistor; and a second load circuit for delivering a load current of the same value as the load current delivered to the drain of the first MOS transistor to the second MOS transistor, wherein an output of the second operational amplifier controls the load currents flowing in the first and second load circuits so that a drain voltage of the second MOS transistor becomes equal to a voltage of the second power supply.

2. A single output differential amplifier circuit as set forth in claim 1, wherein the first load circuit is comprised of a first resistance element having one end connected to the drain of the first MOS transistor and the other end connected to an output terminal of the second operational amplifier, and wherein the second load circuit is comprised of a second resistance element having one end connected to the drain of the second MOS transistor and the other end connected to the output terminal of the second operational amplifier, and having the same resistance value as that of the first resistance element.

3. A single circuit output differential amplifier circuit as set forth in claim 1, wherein the first load circuit is comprised of a third MOS transistor of a second conductivity type different from the first conductivity type, having a drain connected to the drain of the first MOS transistor, a gate connected to an output terminal of the second operational amplifier and a source connected to a fourth power supply, and wherein the second load circuit is comprised of a fourth MOS transistor having a drain connected to the drain of the second MOS transistor, a gate connected to the output terminal of the second operational amplifier and a source connected to the fourth power supply, and having the substantially same characteristic as that of the third MOS transistor of the second conductivity type.

4. An amplifier circuit as set forth in claim 1, which comprises a fifth MOS transistor of the first conductivity type connected in parallel with the first MOS transistor, and a sixth MOS transistor of the first conductivity type connected in parallel with the second MOS transistor.

5. An amplifier circuit as set forth in claim 4,
wherein a divided voltage of an output voltage is applied across gates of the fifth and sixth MOS transistors.

6. An amplifier circuit as set forth in claim 5,
wherein the first and second resistance circuits are omitted.

7. An amplifier circuit as set forth in claim 1,
wherein the first and second resistance circuits are comprised of an MRC (MOS Resistive Circuit).

8. An amplifier circuit as set forth in claim 1, which further comprises
a fifth MOS transistor of the first conductivity type having a source connected to a fifth power supply and a drain connected to the drain of the first MOS transistor, and
a sixth MOS transistor of the first conductivity type in which its characteristic is the same as that of the fifth MOS transistor, the sixth MOS transistor having a source connected to the fifth power supply and a drain connected to the drain of the second MOS transistor.

9. An amplifier circuit as set forth in claim 8, which further comprises
a voltage-dividing circuit provided in place of the first and second resistance circuits and operative to divide a voltage between an output of the first operational amplifier and a voltage of the third power supply,
a full-wave rectifying circuit for carrying out full-wave rectification of output of the voltage-dividing circuit,
a low-pass filter for waveform-shaping and phase-adjusting output of the full-wave rectifying circuit, and
a transconductance circuit adapted to receive output of the low-pass filter, its output being caused to serve as the voltage of the fifth power supply,
wherein an output voltage of the voltage-dividing circuit is applied across gates of the fifth and sixth MOS transistors.

10. An amplifier circuit as set forth in claim 8, which comprises
a voltage-dividing circuit provided in place of the first and second resistance circuits and operative to divide a voltage between an output of the first operational amplifier and a voltage of the third power supply,
a full-wave rectifying circuit adapted to receive differential input voltages applied to the first and second MOS transistors to carry out full-wave rectification thereof,
a low-pass filter for waveform-shaping and phase-adjusting output of the full-wave rectifying circuit, and
a transconductance circuit adapted to receive output of the low-pass filter, its output being caused to serve as a voltage of the first power supply,
wherein an output voltage of the voltage-dividing circuit is applied across gates of the fifth and sixth MOS transistors.

11. A full differential amplifier circuit comprising:
first and second MOS transistors of a first conductivity type in which their characteristics are substantially the same, their sources being commonly connected to a first power supply;
a first operational amplifier having an inverting input terminal connected to a drain of the first MOS transistor and a non-inverting input terminal connected to a drain of the second MOS transistor,
a second operational amplifier having an inverting input terminal connected to the drain of the second MOS transistor and a non-inverting input terminal connected to a second power supply,
a first resistance circuit provided between the drain of the first MOS transistor and an output terminal of the first operational amplifier,
a second resistance circuit having substantially the same resistance value as that of the first resistance circuit provided between the drain of the second MOS transistor and an output terminal of the second operational amplifier,
a first load circuit connected to the drain of the first MOS transistor to deliver load current to the drain of the first MOS transistor, and
a second load circuit connected to the drain of the second MOS transistor to deliver load current equal to the load current delivered to the drain of the first MOS transistor to the second MOS transistor,
wherein outputs of the first and second operational amplifiers are differential outputs and control load currents flowing in the first and second load circuits.

12. An amplifier circuit as set forth in claim 11, which comprises
a fifth MOS transistor of the first conductivity type connected in parallel with the first MOS transistor, and
a sixth MOS transistor of the first conductivity type connected in parallel with the second MOS transistor.

13. An amplifier circuit as set forth in claim 12,
wherein a divided voltage of an output voltage is applied across gates of the fifth and sixth MOS transistors.

14. An amplifier circuit as set forth in claim 13,
wherein the first and second resistance circuits are omitted.

15. An amplifier circuit as set forth in claim 11,
wherein the first and second resistance circuits are comprised of an MRC (MOS Resistive Circuit).

16. An amplifier circuit as set forth in claim 11, which further comprises
a fifth MOS transistor of the first conductivity type having a source connected to a fifth power supply and a drain connected to the drain of the first MOS transistor, and
a sixth MOS transistor of the first conductivity type in which its characteristic is the same as that of the fifth MOS transistor, the sixth MOS transistor having a source connected to the fifth power supply and a drain connected to the drain of the second MOS transistor.

17. An amplifier circuit as set forth in claim 16, which further comprises
a voltage dividing circuit provided in place of the first and second resistance circuits and operative to divide a voltage between an output of the first operational amplifier and a voltage of the third power supply,
a full-wave rectifying circuit for carrying out full-wave rectification of output of the voltage dividing circuit,
a low-pass filter for waveform-shaping and phase-adjusting output of the full-wave rectifying circuit, and
a transconductance circuit adapted to receive output of the low-pass filter, its output being caused to serve as a voltage of the fifth power supply,
wherein an output voltage of the voltage dividing circuit is applied across gates of the fifth and sixth MOS transistors.

18. An amplifier circuit as set forth in claim 16, which comprises
a voltage-dividing circuit provided in place of the first and second resistance circuit and operative to divide a voltage between an output of the first operational amplifier and a voltage of the third power supply, a full-wave rectifying circuit adapted to receive differential input voltages applied to the first and second MOS transistors to carry out full-wave rectification thereof, a low-pass filter for waveform-shaping and phase-adjusting output of the full-wave rectifying circuit, and a transconductance circuit adapted to receive output of the low-pass filter, its output being caused to serve as a voltage of the first power supply, wherein an output voltage of the voltage dividing circuit is applied across gates of the fifth and sixth MOS transistors.

* * * * *